(12) United States Patent
Fan et al.

(10) Patent No.: US 11,899,069 B2
(45) Date of Patent: Feb. 13, 2024

(54) SOC AND SOH CO-ESTIMATION SYSTEMS AND METHODS FOR ELECTRIC VEHICLES

(71) Applicant: Cummins Inc., Columbus, IN (US)

(72) Inventors: Guodong Fan, Columbus, IN (US); Ruigang Zhang, Bargersville, IN (US); Jordan Loos, Phoenix, OR (US); Aleksey Yezerets, Columbus, IN (US)

(73) Assignee: CUMMINS INC., Columbus, IN (US)

( * ) Notice: Subject to any disclaimer, the term of this patent is extended or adjusted under 35 U.S.C. 154(b) by 141 days.

(21) Appl. No.: 17/193,555

(22) Filed: Mar. 5, 2021

(65) Prior Publication Data

US 2021/0190867 A1 Jun. 24, 2021

Related U.S. Application Data

(63) Continuation-in-part of application No. PCT/US2019/065171, filed on Dec. 9, 2019.

(Continued)

(51) Int. Cl.
*G01R 31/367* (2019.01)
*G01R 31/392* (2019.01)
(Continued)

(52) U.S. Cl.
CPC ............ *G01R 31/367* (2019.01); *B60L 58/14* (2019.02); *B60L 58/16* (2019.02); *B60L 58/26* (2019.02);
(Continued)

(58) Field of Classification Search
None
See application file for complete search history.

(56) References Cited

U.S. PATENT DOCUMENTS

| 7,994,755 B2 | 8/2011 | Plett |
| 8,519,675 B2 | 8/2013 | Plett |

(Continued)

FOREIGN PATENT DOCUMENTS

CN 104569825 * 4/2018 ........... G01R 31/388

OTHER PUBLICATIONS

International Search Report and Written Opinion issued by the ISA/US Commissioner for Patents, dated Feb. 21, 2020, for International Application No. PCT/US2019/065171; 8 pages.

(Continued)

*Primary Examiner* — Brent A. Fairbanks
(74) *Attorney, Agent, or Firm* — Faegre Drinker Biddle & Reath LLP

(57) ABSTRACT

A system is provided for performing a power estimation process for an electric vehicle using a controller. The controller estimates an inner state of an energy storage supply of the electric vehicle. The inner state represents a state-of-charge (SOC) and/or a state-of-health (SOH) of the energy storage supply. The controller also estimates an SOC value and/or an SOH value of the energy storage supply based on at least one of: a present current level, a present voltage level, a present temperature, and time-based information. The controller further estimates a bounded SOC value based on the SOC value, a first upper bound, a the first lower bound, and/or estimates a bounded SOH value based on the SOH value, a second upper bound, and a second lower bound. The controller then controls an electrification process of the electric vehicle based on the bounded SOC and/or SOH values.

10 Claims, 17 Drawing Sheets

Related U.S. Application Data

(60) Provisional application No. 63/036,198, filed on Jun. 8, 2020, provisional application No. 62/783,615, filed on Dec. 21, 2018.

(51) Int. Cl.
  *G01R 31/36* (2020.01)
  *B60L 58/14* (2019.01)
  *G01R 31/388* (2019.01)
  *B60L 58/26* (2019.01)
  *B60L 58/16* (2019.01)
  *G01R 31/3842* (2019.01)

(52) U.S. Cl.
  CPC ....... *G01R 31/3648* (2013.01); *G01R 31/388* (2019.01); *G01R 31/3842* (2019.01); *G01R 31/392* (2019.01)

(56) References Cited

U.S. PATENT DOCUMENTS

| | | | |
|---|---|---|---|
| 8,918,300 | B2 | 12/2014 | Baba et al. |
| 9,329,240 | B2 | 5/2016 | Baba et al. |
| 9,869,725 | B2 | 1/2018 | Chaturvedi et al. |
| 9,960,625 | B2 | 5/2018 | Klein et al. |
| 2009/0027056 | A1* | 1/2009 | Huang ................. G01R 31/392 320/132 |
| 2014/0239914 | A1 | 8/2014 | Igarashi et al. |
| 2014/0347012 | A1* | 11/2014 | Shim .................... G01R 31/382 320/134 |
| 2015/0112619 | A1* | 4/2015 | Takahashi .......... G01R 31/3835 702/63 |
| 2015/0349385 | A1* | 12/2015 | Hu ....................... G01R 31/367 702/63 |
| 2016/0064972 | A1 | 3/2016 | Stefanopoulou et al. |
| 2016/0221465 | A1* | 8/2016 | Kratzer .................. B60L 58/16 |
| 2017/0003352 | A1* | 1/2017 | Barre .................. G01R 31/007 |
| 2017/0108552 | A1 | 4/2017 | Roumi et al. |
| 2017/0170684 | A1* | 6/2017 | Matthey ............... G05B 13/026 |
| 2018/0246173 | A1* | 8/2018 | Singh .................. G01R 31/392 |
| 2019/0128969 | A1* | 5/2019 | Fang .................... H01M 10/44 |
| 2020/0150185 | A1* | 5/2020 | Ramezan Pour Safaei ................. H01M 10/48 |

OTHER PUBLICATIONS

Maletic, Filip et al. "Dual Nonlinear Kalman Filter-Based SoC and Remaining Capacity Estimation for an Electric Scoot Li-NMC Battery Pack", published Jan. 22, 2020, www.mdpi.com/journal/energies.

N. A. Azis, E. Joelianto and A. Widyotriatmo, "State of Charge (SoC) and State of Health (SoH) Estimation of Lithium-Ion Battery Using Dual Extended Kalman Filter Based on Polynomial Battery Model," 2019 6th International Conference on Instrumentation, Control, and Automation (ICA), 2019, pp. 88-93, doi: 10.1109/ICA. 2019.8916734.

\* cited by examiner

SOC AND SOH CO-ESTIMATION SYSTEMS AND METHODS FOR ELECTRIC VEHICLES

CROSS-REFERENCE TO RELATED APPLICATIONS

This application is a continuation-in-part of International Application No. PCT/US2019/065171, filed on Dec. 9, 2019, which claims the benefit of U.S. Provisional Application No. 62/783,615, filed on Dec. 12, 2018. The present application also claims the benefit of U.S. Provisional Application No. 63/036,198, filed on Jun. 8, 2020.

TECHNICAL FIELD

This disclosure relates generally to methods and systems for diagnosing a power management system used in electric vehicles, and more particularly to estimating an inner state of an energy storage supply of the power management system.

BACKGROUND

A power management system can be used for both a pure electric vehicle (EV) and/or a hybrid electric vehicle (HEV) having an electric motor and an internal combustion engine (ICE). The term "electric vehicles," as used herein, refers to hybrid and/or pure electric vehicles which provide an alternative to conventional fuel engine systems for either supplementing or completely replacing the engine systems, such as ICEs. In one example, an electric vehicle is an extended range electric vehicle (EREV). In the EREV, primary electric drive is achieved with a battery or related rechargeable energy storage system (RESS) that acts as a direct current (DC) voltage source to a motor, generator or transmission that in turn can be used to provide the energy needed to rotate one or more of the vehicle's wheels. When the electrical charge from the RESS has been depleted, backup power may come from the ICE to provide auxiliary onboard electrical energy generation.

During operation, the power management system estimates an inner state of an energy storage supply, such as a battery, in the electric vehicle for maintaining a proper level of electric power within its operational range. Typically, the inner state of the energy storage supply is a state-of-charge (SOC) and/or a state-of-health (SOH) of the energy storage supply. For example, the SOC information can be used as a fuel gauge for the battery, and the SOH information can be used as an indication of a present total capacity and/or internal resistance of the battery. In another example, the SOC information represents an available energy or power left in the energy storage supply, and the SOH information represents a degree of degradation of the energy storage supply.

Since the SOC and SOH information cannot be directly measured, an estimation algorithm is used to estimate the SOC and SOH information of the energy storage supply. An existing estimation algorithm, known as a Kalman filter, can be used to estimate the SOC and SOH information. Exemplary Kalman filters include a dual nonlinear Kalman filter (DKF) (DNKF), an extended Kalman filter, an unscented Kalman filter, a cubature Kalman filter, and the like. The Kalman filter estimates the SOC and SOH information of the energy storage supply by calculating estimated SOC and SOH values, and corresponding error bounds.

However, such dual estimation methods of the Kalman filter are prone to diverge after a predetermined period. For example, the SOC and SOH estimation can be initially accurate for a newly assembled and verified battery pack, but the divergence of the SOC and SOH estimation can occur after a certain time period due to increasing sensor bias and noise, hardware and/or software malfunctions of the power management system, or battery degradation caused by aging components of the electric vehicle. Further, a large SOC and SOH estimation divergence can cause unwanted damage to the power management system and other components of the electric vehicle.

As such, it is desirable to reduce or eliminate the SOC and SOH estimation divergence and limit the corresponding error bounds. Accordingly, there are opportunities to develop enhanced power management systems and methods that can more efficiently estimate the SOC and SOH information of the energy storage supply.

SUMMARY

In one embodiment of the present disclosure, a controller is provided for performing a power estimation process for an electric vehicle. The controller includes a processor and a memory. The memory includes instructions that, when executed by the processor, cause the controller to perform the power estimation process by estimating an inner state of an energy storage supply of the electric vehicle using the processor. The inner state represents at least one of: a state-of-charge (SOC) and a state-of-health (SOH) of the energy storage supply. The processor also causes the controller to estimate at least one of: an SOC value and an SOH value of the energy storage supply based on at least one of: a present current level, a present voltage level, and a present temperature associated with the energy storage supply, and time-based information. The processor further causes the controller to at least one of: calculate a first upper bound and a first lower bound that are associated with the SOC value and estimate a bounded SOC value of the energy storage supply based on the SOC value, the first upper bound, and the first lower bound, and calculate a second upper bound and a second lower bound that are associated with the SOH value and estimate a bounded SOH value of the energy storage supply based on the SOH value, the second upper bound, and the second lower bound. The controller then controls an electrification process of the electric vehicle based on at least one of: the bounded SOC value and the bounded SOH value.

In one aspect, the processor causes the controller to calculate an amp-hour SOC and a voltage SOC. The amp-hour SOC is based on the present current level and the present temperature associated with the energy storage supply, and the voltage SOC is based on the present voltage level and the present temperature associated with the energy storage supply. The processor then causes the controller to calculate the first upper bound and the first lower bound associated with the SOC value based on the amp-hour SOC and the voltage SOC. A maximum value of the amp-hour SOC and the voltage SOC can be used for the first upper bound, while a minimum value of the amp-hour SOC and the voltage SOC can be used for the first lower bound. The processor further causes the controller to filter the voltage SOC to remove noise.

In another aspect, the processor causes the controller to calculate a full-cycle SOH and a partial-cycle SOH. The full-cycle SOH is based on a starting time and an ending time associated with a full charge cycle of the energy storage supply, and the partial-cycle SOH is based on a starting time and an ending time associated with a partial charge cycle of the energy storage supply. The processor then causes the controller to calculate the second upper bound and the second lower bound associated with the SOH value based on the full-cycle SOH and the partial-cycle SOH. A maximum value of the full-cycle SOH and the partial-cycle SOH can be used for the second upper bound, while a minimum value of the full-cycle SOH and the partial-cycle SOH can be used for the second lower bound.

In yet another aspect, the time-based information includes one or more historically estimated values of the SOC value and SOH value. In still another aspect, the processor causes the controller to estimate the bounded SOC value and bounded SOH value based on whether a predetermined period has passed. In a further aspect, the controller controls the electrification process by at least one of: modifying a cooling of the energy storage supply, modifying charge/discharge limits of the energy storage supply, reducing a number of charging/discharging cycles of the energy storage supply, and modifying a minimum SOC threshold. The controller may include a dual Kalman filter.

In another embodiment of the present disclosure, a method is provided for performing a power estimation process for an electric vehicle using a controller. The method includes performing the power estimation process by estimating an inner state of an energy storage supply of the electric vehicle, with the inner state representing at least one of: a state-of-charge (SOC) and a state-of-health (SOH) of the energy storage supply. The method also includes estimating at least one of: an SOC value and an SOH value of the energy storage supply based on at least one of: a present current level, a present voltage level, and a present temperature associated with the energy storage supply, and time-based information. The method further includes calculating a first upper bound and a first lower bound that are associated with the SOC value, estimating a bounded SOC value of the energy storage supply based on the SOC value, the first upper bound, and the first lower bound, calculating a second upper bound and a second lower bound that are associated with the SOH value, and estimating a bounded SOH value of the energy storage supply based on the SOH value, the second upper bound, and the second lower bound. Further, the method includes controlling an electrification process of the electric vehicle based on at least one of: the bounded SOC value and the bounded SOH value.

In one aspect, the method includes calculating an amp-hour SOC and a voltage SOC. The amp-hour SOC is based on the present current level and the present temperature associated with the energy storage supply, and the voltage SOC is based on the present voltage level and the present temperature associated with the energy storage supply. The method also includes calculating the first upper bound and the first lower bound associated with the SOC value based on the amp-hour SOC and the voltage SOC. A maximum value of the amp-hour SOC and the voltage SOC can be used for the first upper bound, while a minimum value of the amp-hour SOC and the voltage SOC can be used for the first lower bound. The method further includes filtering the voltage SOC to remove noise.

In another aspect, the method includes calculating a full-cycle SOH and a partial-cycle SOH. The full-cycle SOH is based on a starting time and an ending time associated with a full charge cycle of the energy storage supply, and the partial-cycle SOH is based on a starting time and an ending time associated with a partial charge cycle of the energy storage supply. The method also includes calculating the second upper bound and the second lower bound associated with the SOH value based on the full-cycle SOH and the partial-cycle SOH. A maximum value of the full-cycle SOH and the partial-cycle SOH can be used for the second upper bound, while a minimum value of the full-cycle SOH and the partial-cycle SOH can be used for the second lower bound.

In yet another aspect, the time-based information includes one or more historically estimated values of the SOC value and SOH value. In still another aspect, the method includes estimating the bounded SOC value and bounded SOH value based on whether a predetermined period has passed. In a further aspect, the method includes controlling the electrification process by at least one of: modifying a cooling of the energy storage supply, modifying charge/discharge limits of the energy storage supply, reducing a number of charging/discharging cycles of the energy storage supply, and modifying a minimum SOC threshold. The method for performing power estimation process may be carried out by a dual Kalman filter.

While multiple embodiments are disclosed, still other embodiments of the presently disclosed subject matter will become apparent to those skilled in the art from the following detailed description, which shows and describes illustrative embodiments of the disclosed subject matter. Accordingly, the drawings and detailed description are to be regarded as illustrative in nature and not restrictive.

BRIEF DESCRIPTION OF THE DRAWINGS

The above mentioned and other features and objects of this disclosure, and the manner of attaining them, will become more apparent and the disclosure itself will be better understood by reference to the following description of an embodiment of the disclosure taken in conjunction with the accompanying drawings, wherein.

Figure 1:
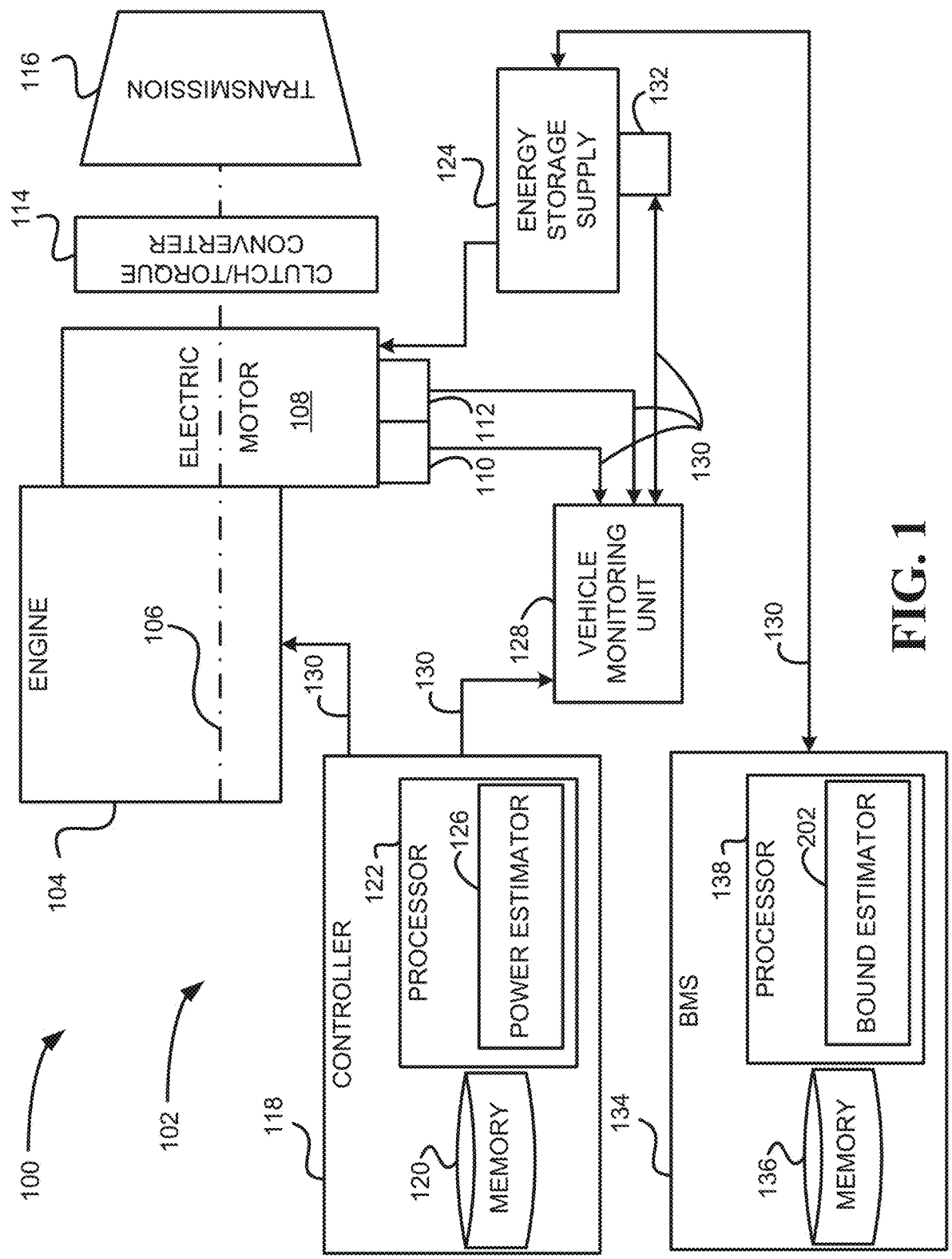
FIG. 1 is a schematic diagram of an engine and electric motor system featuring a power estimator for electric vehicles in accordance with embodiments of the present disclosure.

Corresponding reference characters indicate corresponding parts throughout the several views. Although the drawings represent embodiments of the present disclosure, the drawings are not necessarily to scale, and certain features may be exaggerated in order to better illustrate and explain the present disclosure. The exemplification set out herein illustrates an embodiment of the disclosure, in one form, and such exemplifications are not to be construed as limiting the scope of the disclosure in any manner.

DETAILED DESCRIPTION

The embodiment disclosed below is not intended to be exhaustive or limit the disclosure to the precise form disclosed in the following detailed description. Rather, the embodiment is chosen and described so that others skilled in the art may utilize its teachings. One of ordinary skill in the art will realize that the embodiments provided can be implemented in hardware, software, firmware, and/or a combination thereof. Programming code according to the embodiments can be implemented in any viable programming language such as C, C++, HTML, XTML, JAVA or any other viable high-level programming language, or a combination of a high-level programming language and a lower level programming language.

Referring now to FIG. 1, a hybrid system 100 for an electric vehicle 102 is illustrated. Electric vehicle 102 can be plugged into an electrical outlet to be connected to a power grid system (not shown) for performing an electrification process of electric vehicle 102. In various embodiments, the electrification process may refer to various operations related to electricity generation and electric power distribution and management associated with electric vehicle 102. Exemplary electrification processes include modification of the battery cooling, modification of the charge and/or discharge limits, reducing the number of charging and/or discharging cycles, modification of the minimum state-of-charge threshold, and the like. Electric vehicle 102 may be a commercial vehicle, such as a transit bus, that is connectable to the power grid system.

In one embodiment, the power grid system can be a grid system implemented in a specific commercial facility, such as a bus depot. In another embodiment, the power grid system can be a grid system implemented in a grid network incorporating a plurality of power stations, such as power plants and other power-generating facilities. In FIG. 1, although electric vehicle 102 is depicted as a parallel hybrid system, the present disclosure can also be applied to a range-extended vehicle or a series hybrid vehicle to suit different applications. As such, electric vehicle 102 may be any electric vehicle having an electric propulsion system (e.g., hybrid, pure electric, and/or range-extended vehicles).

Although electric vehicle 102 with an internal combustion engine (ICE) 104 is shown, the present disclosure can be applied to a pure electric vehicle powered by only batteries without ICE 104. ICE 104 can be powered by any type of fuel, such as gasoline, diesel, natural gas, liquefied petroleum gases, biofuels, and the like. In this embodiment, hybrid system 100 can include ICE 104 having a crankshaft 106 and a crankshaft sprocket (not shown) coupled to the crankshaft. ICE 104 is not particularly limited and can be on-board (e.g., a range-extended vehicle) or off-board (e.g., a genset located at the bus depot).

Hybrid system 100 can also include an electric motor 108 in mechanical communication with the crankshaft sprocket. For example, electric motor 108 can be a traction motor used for propulsion of electric vehicle 102. In various embodiments, electric motor 108 can be coupled to a speed sensor 110, a torque sensor 112, ICE 104, a clutch or torque converter 114, and a transmission 116 via crankshaft 106. In various embodiments, speed sensor 110 and electric motor 108 are in mechanical communication with crankshaft 106. Also, electric motor 108 is not particularly limited and, for example, can be a motor/generator, synchronous motor, or an induction motor.

In embodiments, hybrid system 100 also includes a controller 118 in electrical communication with speed sensor 110 and torque sensor 112. Controller 118 can include a non-transitory memory 120 having instructions that, in response to execution by a processor 122, cause processor 122 to determine a speed or torque value of electric motor 108. Electric motor 108 receives electric power from a rechargeable energy storage supply 124, such as a battery pack or assembly, and energy storage supply 124 can provide data representative of state-of-charge (SOC) and/or state-of-health (SOH) information to controller 118. Processor 122, non-transitory memory 120, and controller 118 are not particularly limited and can, for example, be physically separate. Additionally, a vehicle monitoring unit 128 can be included in controller 118 or can be an independent unit separate from controller 118 to suit different applications.

In certain embodiments, controller 118 can form a portion of a processing subsystem including one or more computing devices having memory, processing, and communication hardware. Controller 118 can be a single device or a distributed device, and functions of controller 118 can be performed by hardware and/or as computer instructions on a non-transient computer readable storage medium, such as non-transitory memory 120.

In certain embodiments, controller 118 includes one or more interpreters, determiners, evaluators, regulators, and/or processors 122 that functionally execute the operations of controller 118. The description herein including interpreters, determiners, evaluators, regulators, and/or processor emphasizes the structural independence of certain aspects of controller 118 and illustrates one grouping of operations and responsibilities of controller 118. Other groupings that execute similar overall operations are understood within the scope of the present disclosure. Interpreters, determiners, evaluators, regulators, and processors can be implemented in hardware and/or as computer instructions on a non-transient computer readable storage medium, and can be distributed across various hardware or computer-based components.

Example and non-limiting implementation elements that functionally execute the operations of controller 118 include sensors, such as speed sensor 110 and torque sensor 112, providing any value determined herein, sensors providing any value that is a precursor to a value determined herein, datalink and/or network hardware including communication chips, oscillating crystals, communication links, cables, twisted pair wiring, coaxial wiring, shielded wiring, transmitters, receivers, and/or transceivers, logic circuits, hard-wired logic circuits, reconfigurable logic circuits in a particular non-transient state configured according to the module specification, any actuator including at least an electrical, hydraulic, or pneumatic actuator, a solenoid, an op-amp, analog control elements (springs, filters, integrators, adders, dividers, gain elements), and/or digital control elements.

Certain operations described herein include operations to interpret and/or to determine one or more parameters or data structures. Interpreting or determining, as utilized herein, includes receiving values by any method known in the art, including at least receiving values from a datalink or network communication, receiving an electronic signal (e.g. a voltage, frequency, current, or PWM signal) indicative of the value, receiving a computer generated parameter indicative of the value, reading the value from a memory location on a non-transient computer readable storage medium, receiving the value as a run-time parameter by any means known in the art, and/or by receiving a value by which the interpreted parameter can be calculated, and/or by referencing a default value that is interpreted to be the parameter value.

In the illustrated embodiment, controller 118 includes a power estimator 126 configured to estimate an inner state of energy storage supply 124 of electric vehicle 102. The inner state of energy storage supply 124 represents the SOC and/or SOH of energy storage supply 124. Power estimator 126 may be configured to set at least one of an upper bound and a lower bound for estimating the SOC and/or SOH of energy storage supply 124. During a power estimation process of the SOC and/or SOH of energy storage supply 124, power estimator 126 automatically applies at least one of the upper bound and the lower bound to filter out or cut off high or low values associated with the SOC and/or SOH of energy storage supply 124, thereby preventing any potential large estimation divergence that can cause unwanted damage to electric vehicle 102. Power estimator 126 may perform the power estimation process for the SOC and SOH information of energy storage supply 124 using independent and separate bounding algorithms. Detailed descriptions of the bounding algorithms are provided below in paragraphs relating to FIGS. 3-9.

In one embodiment, power estimator 126 is configured to measure a present current level and/or a present voltage level of energy storage supply 124 by using a vehicle monitoring unit 128. For example, power estimator 126 is configured to automatically communicate with vehicle monitoring unit 128 to determine the present current and voltage levels of energy storage supply 124 of electric vehicle 102. In one embodiment, vehicle monitoring unit 128 can be a telematics system associated with electric vehicle 102. In embodiments, vehicle monitoring unit 128 is configured to monitor one or more vehicle characteristics related to electric vehicle 102.

For example, vehicle characteristics can include information of one or more components of electric vehicle 102, such as ICE 104 or electric motor 108, navigational information based on a navigation system (e.g., a global positioning system (GPS)), thermal information (e.g., a temperature) of one or more components of electric vehicle 102, such as a current temperature of electric motor 108, environment information related to a specific route for a mission of electric vehicle 102 (e.g., time of day, weather, road or load conditions, etc.). Other exemplary components of electric vehicle 102 can include electrification, powertrain, and various vehicle components, such as energy storage supply 124 (e.g., a battery), electric motor 108, ICE 104, a charging system, a cooling system, a separate generator (not shown), a drivetrain or powertrain (e.g., a crankshaft), a drive axle assembly (not shown), and the like.

In embodiments, power estimator 126 automatically communicates with vehicle monitoring unit 128 to obtain thermal information of at least one electric device of electric vehicle 102, such as energy storage supply 124, provided to vehicle monitoring unit 128 by a temperature sensor 132. For example, power estimator 126 communicates with vehicle monitoring unit 128 to detect a temperature of a battery pack. In another example, power estimator 126 communicates with vehicle monitoring unit 128 to detect a temperature of electric motor 108. Other suitable uses of temperature sensor 132 are also contemplated to suit the application.

In one embodiment, power estimator 126 interfaces with a network 130, such as a wireless communication facility (e.g., a Wi-Fi access point). In another embodiment, network 130 can be a controller area network (e.g., CAN bus) on-board electric vehicle 102. In yet another embodiment, network 130 can be a cloud computing network off-board electric vehicle 102. Other similar networks known in the art are also contemplated. For example, network 130 can be a cloud network or a vehicle-to-grid (V2G) network between electric vehicle 102 and the power grid system, or a vehicle-to-vehicle (V2V) network between electric vehicles 102. In embodiments, any type of computer network having a collection of computers, servers, and other hardware interconnected by communication channels is contemplated, such as the Internet, Intranet, Ethernet, LAN, cloud network, etc.

Figure 2B:
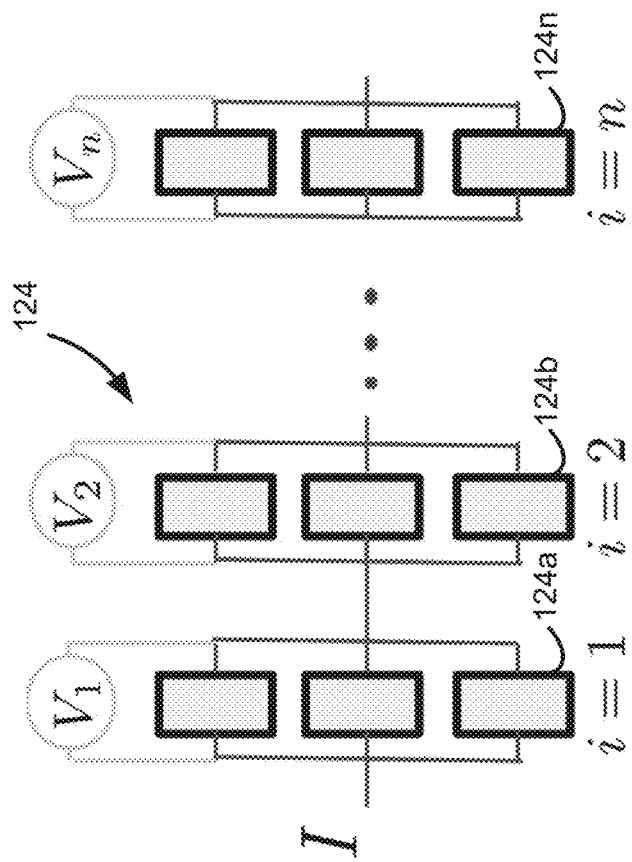
FIGS. 2A and 2B illustrate exemplary configurations of an energy storage supply used in the electric vehicles in accordance with embodiments of the present disclosure.
Figure 2A:
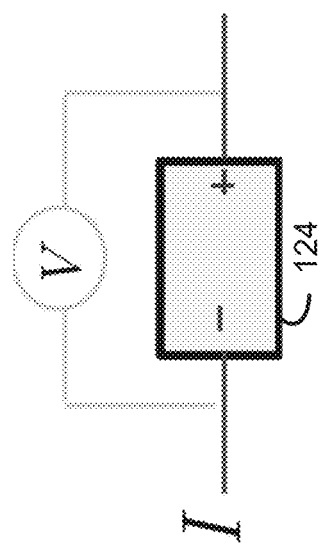

Referring now to FIGS. 2A and 2B, exemplary configurations of energy storage supply 124 are shown. In FIG. 2A, energy storage supply 124 includes a single battery. In one embodiment, vehicle monitoring unit 128 can measure a present voltage level V and a present current level I of energy storage supply 124 and transmit the present voltage level V and the present current level I to power estimator 126 for subsequent processing as desired. In FIG. 2B, storage supply 124 includes a battery pack having a plurality of battery cells 124a, 124b, . . . 124n. In this example, the battery pack includes a first array (e.g., i=1) having battery cells 124a, a second array (e.g., i=2) having battery cells 124b, and an n-th array (e.g., i=n) having battery cells 124n. In one embodiment, vehicle monitoring unit 128 can measure a present voltage level $V_1, V_2, \ldots V_n$ of each array and a present current level I of energy storage supply 124 and transmit the present voltage level $V_1, V_2, \ldots V_n$ and the present current level I to power estimator 126 for subsequent processing as desired. Other suitable arrangements are also contemplated to suit different applications.

Various embodiments of power estimators and SOC bounding processes are described with reference to FIGS. 3-9. Additional embodiments depicting methods to estimate SOC bounds are described with reference to FIGS. 10A-15B. The foregoing embodiments may be implemented in the vehicles described with reference to FIGS. 1, 2A and 2B, as described below.

Figure 3:
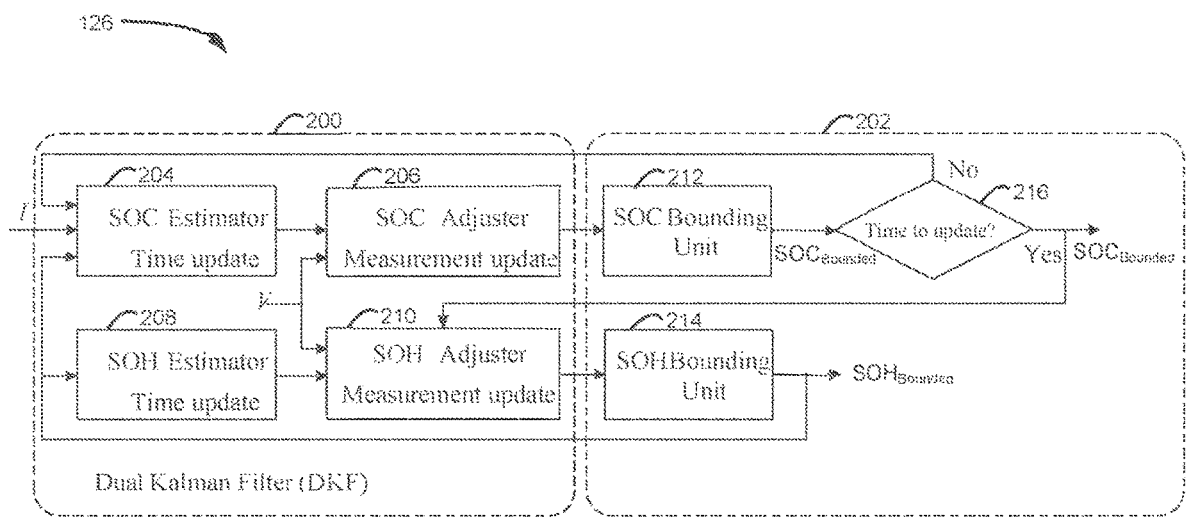
FIG. 3 is a schematic diagram of the power estimator of FIG. 1 in accordance with embodiments of the present disclosure.

Referring now to FIG. 3, an exemplary schematic diagram of power estimator 126 is shown. In the illustrated embodiment, power estimator 126 includes an SOC/SOH estimator 200 and a bound estimator 202. SOC/SOH estimator 200 is configured to estimate an SOC value $SOC_{Est}$ (e.g., 60%) based on a present current level I and/or a present voltage level V of energy storage supply 124. For example, SOC/SOH estimator 200 can be the DKF. Further, SOC/SOH estimator 200 is configured to estimate an SOH value $SOH_{Est}$ (e.g., 80%) based on the present current level I and/or the present voltage level V of energy storage supply 124.

Although power estimator 126 is shown in FIG. 3 as integrating SOC/SOH estimator 200 and bound estimator 202, in some embodiments, SOC/SOH estimator 200 and bound estimator 202 can be installed separately or independently in any suitable systems associated with electric vehicle 102. Returning to FIG. 1, in one embodiment, a battery management system (BMS) 134 can be installed separately from controller 118. BMS 134 can include another non-transitory memory 136 and processor 138. In this example, BMS 134 can include bound estimator 202 in processor 138 together with other control algorithms. In another example, BMS 134 can include SOC/SOH estimator 200 in processor 138 to suit different applications. In various embodiments, BMS 134 may perform the power estimation process for the SOC and SOH information of energy storage supply 124. Also, BMS 134 can provide an estimation of available power of energy storage supply 124.

Returning to FIG. 3, in one embodiment, SOC/SOH estimator 200 includes an SOC estimator 204, an SOC adjuster 206, an SOH estimator 208, and an SOH adjuster 210. SOC estimator 204 is configured to estimate $SOC_{Est}$ based on the present current level I of energy storage supply 124, a generic embedded battery model, and/or time-based information. For example, $SOC_{Est}$ can be estimated based on the time-based information having one or more historical inputs of $SOC_{Est}$ measured for electric vehicle 102. SOC adjuster 206 is configured to receive $SOC_{Est}$ from SOC estimator 204 and adjust $SOC_{Est}$ based on the present voltage level V of energy storage supply 124. For example, $SOC_{Est}$ can be corrected or tuned based on the present voltage level V of energy storage supply 124 that is currently measured by vehicle monitoring unit 128.

SOH estimator 208 is configured to estimate $SOH_{Est}$ based on a generic embedded battery model and the time-based information. For example, $SOH_{Est}$ can be estimated based on the historical inputs of $SOH_{Est}$ measured for electric vehicle 102. SOH adjuster 210 is configured to receive $SOH_{Est}$ from SOH estimator 208 and adjust $SOH_{Est}$ based on the present voltage level V of energy storage supply 124. For example, $SOH_{Est}$ can be corrected or tuned based on the present voltage level V of energy storage supply 124 that is currently measured by vehicle monitoring unit 128. In some embodiments, other suitable parameters that change with an aging process of energy storage supply 124, such as cell resistance, impedance, or conductance, can also be used to estimate $SOH_{Est}$.

In one embodiment, bound estimator 202 is configured to estimate a bounded SOC value $SOC_{Bounded}$ and/or a bounded SOH value $SOH_{Bounded}$. For example, bound estimator 202 calculates $SOC_{Bounded}$ such that $SOC_{Bounded}$ is set between an upper bound of $SOC_{Est}$ and a lower bound of $SOC_{Est}$. In another example, bound estimator 202 calculates $SOH_{Bounded}$ such that $SOH_{Bounded}$ is set between an upper bound of $SOH_{Est}$ and a lower bound of $SOH_{Est}$.

In the illustrated embodiment, bound estimator 202 includes an SOC bounding unit 212 and an SOH bounding unit 214. In one embodiment, SOC bounding unit 212 is configured to calculate the upper and lower bounds for $SOC_{Bounded}$ based on an amp-hour-based (Ah-based) SOC value $SOC_{Ah}$ and a voltage-based SOC value $SOC_V$. In one embodiment, SOH bounding unit 214 is configured to calculate the upper and lower bounds for $SOH_{Bounded}$ based on a full-cycle-based SOH value $SOH_F$ and a partial-cycle-based SOH value $SOH_P$. For example, $SOH_F$ can be calculated when a full charge cycle is available for energy storage supply 124, and SOH can be calculated when a partial charge cycle is available for energy storage supply 124.

In some embodiments, bound estimator 202 can determine at block 216 whether a predetermined period (e.g., macro time of approximately 1-2 months) has passed since $SOC_{Bounded}$ has been updated. The predetermined period can be adjusted as desired. When bound estimator 202 determines that it is time to update $SOC_{Bounded}$ based on the predetermined period, SOC bounding unit 212 outputs $SOC_{Bounded}$ for subsequent processing by other systems of electric vehicle 102.

For example, $SOC_{Bounded}$ can be transmitted to SOH adjuster 210 or to a display device to be viewed by a technician. In another example, when bound estimator 202 determines that it is not the time to update $SOC_{Bounded}$ based on the predetermined period, $SOC_{Bounded}$ can be transmitted to SOC estimator 204 as a feedback value. Although block 216 is shown for $SOC_{Bounded}$, block 216 can be implemented for $SOH_{Bounded}$ to suit the application. Also, $SOH_{Bounded}$ can be transmitted to at least one of: SOC estimator 204 and SOH estimator 208 as feedback values, or to the display device for subsequent viewing.

Figure 4:
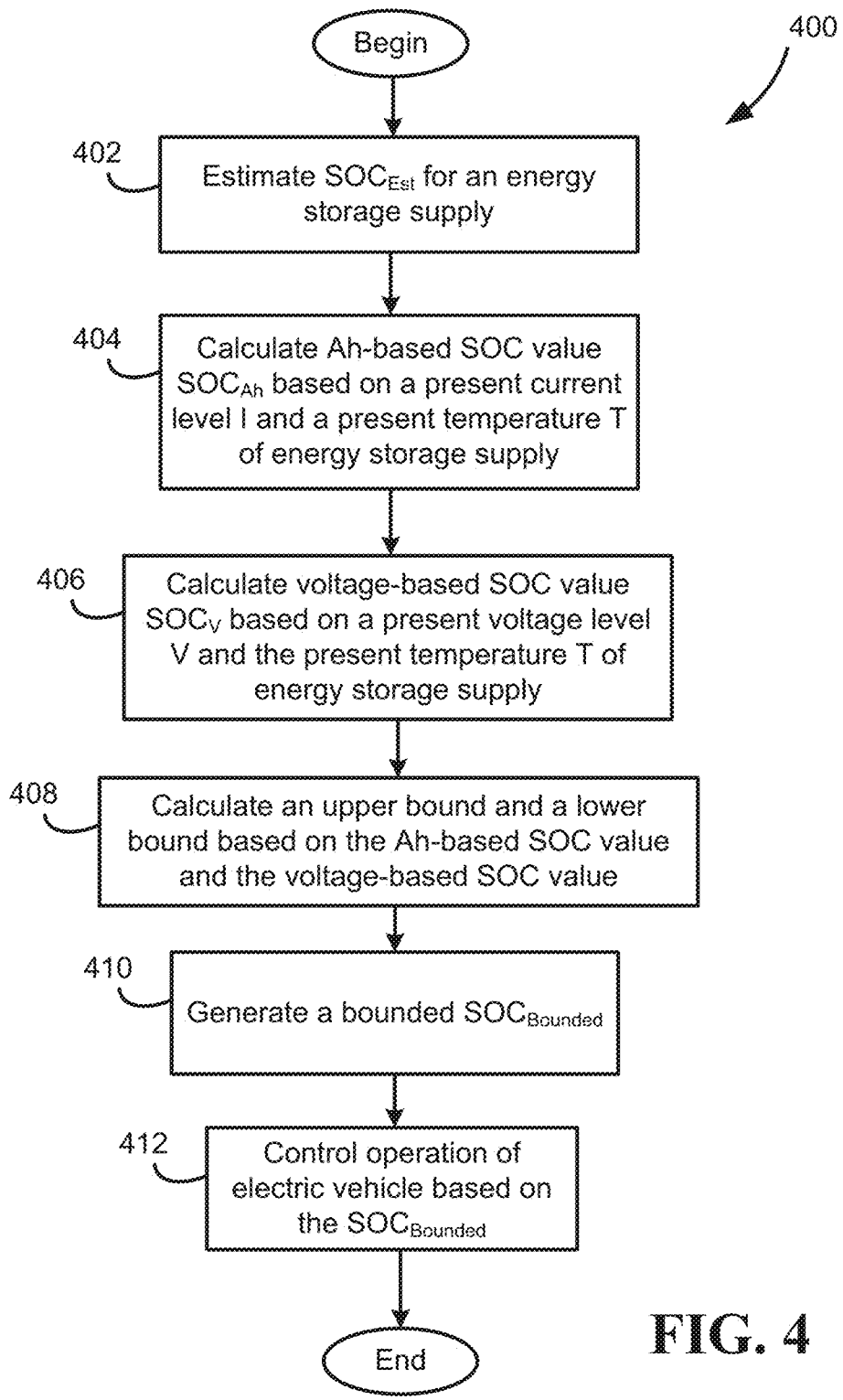
FIG. 4 is a flow chart depicting an exemplary SOC bounding process using the power estimator of FIG. 1 in accordance with embodiments of the present disclosure.

Referring now to FIG. 4, an illustrative SOC bounding process is shown in accordance with embodiments of the subject matter disclosed herein. As disclosed herein, hybrid system 100 is not particularly limited and can perform any of the methods described within the scope of this disclosure. In FIG. 4, a method 400 of performing the SOC bounding process is shown using SOC bounding unit 212. More specifically, when a single battery is used for energy storage supply 124 (e.g., FIG. 2A), for a predetermined period (e.g., micro time of approximately 1-2 seconds), SOC bounding unit 212 performs one or more steps shown in FIG. 4.

At block 402, SOC estimator 204 estimates $SOC_{Est}$ based on the present current level I of energy storage supply 124 and the time-based information. For example, a generic SOC estimator, such as the DKF, can be used to estimate $SOC_{Est}$.

At block 404, SOC bounding unit 212 calculates $SOC_{Ah}$ based on the present current level I and a present temperature T of energy storage supply 124. In one example, $SOC_{Ah}$ can be calculated using a coulomb counting technique. An exemplary $SOC_{Ah}$ can be defined as shown in expression (1) below.

$$SOC_{Ah}(t) = SOC_0 - \frac{\int_{t_0}^{t} I(t)dt}{\text{Capacity}} \quad (1)$$

where I(t) is an input current during time t, $SOC_0$ denotes an initial SOC at an initial time of $t_0$, and Capacity denotes a present total capacity generated by energy storage supply 124.

At block 406, SOC bounding unit 212 calculates $SOC_V$ based on the present voltage level V and the present temperature T of energy storage supply 124. An exemplary $SOC_V$ can be defined as shown in expression (2) below. In one embodiment, $SOC_V$ can be filtered to remove noises caused by a dynamic voltage response.

$$SOC_V(t) = [OCV^{-1}(V(t)+I(t) \cdot R_0(T))]_{filtered} \quad (2)$$

where OCV is a battery open circuit voltage, which is a function of SOC, $R_0$ denotes a battery internal resistance, which is dependent on the temperature T. In one example, filtered can be performed using a single-pole low-pass filter. In one embodiment, the single-pole low-pass filter can be used to remove the amplified noise in $SOC_V$ that may have been caused by the measurement and the imperfect fidelity of the OCV approximation. Other suitable filters are also contemplated to suit different applications. In another example, a linear-phase low-pass filter can be also used to remove the amplification noise.

At block 408, SOC bounding unit 212 calculates an upper bound and a lower bound of $SOC_{Est}$ based on $SOC_{Ah}$ and $SOC_V$ calculated in blocks 404 and 406, respectively. An exemplary upper bound can be defined as shown in expressions (3) and (5), and an exemplary lower bound can be defined as shown in expressions (4) and (6).

$$SOC_{u,bnd}(t) = \max\{SOC_{Ah}(t), SOC_V(t)\} + |SOC_{Ah}(t) - SOC_V(t)| + E_{desg} \quad (3)$$

$$SOC_{l,bnd}(t) = \min\{SOC_{Ah}(t), SOC_V(t)\} - |SOC_{Ah}(t) - SOC_V(t)| - E_{desg} \quad (4)$$

$$SOC_{u,bnd}(t) \in [0,1] \quad (5)$$

$$SOC_{l,bnd}(t) \in [0,1] \quad (6)$$

where $E_{desg}$ denotes a predetermined or designed error margin selected by SOC bounding unit 212.

As shown in expressions (3) and (4) above, a maximum value of $SOC_{Ah}$ and $SOC_V$ can be used as a baseline for the upper bound, but an extra margin can be applied. Also, a minimum value of $SOC_{Ah}$ and $SOC_V$ can be used as a baseline for the lower bound, then the extra margin can be applied. For example, an abstract value between $SOC_{Ah}$ and $SOC_V$ can be used as the extra margin by considering the errors/noises in a current sensor and/or a voltage sensor and modeling other errors from the measured voltage shown in expression (2) (e.g., OCV calculated as a function of SOC). As such, the abstract value of $|SOC_{Ah} - SOC_V|$ can represent a degree of uncertainty in measurements and/or the model used for the SOC bounding process. In some embodiments, an additional accuracy margin, such as $E_{desg}$, can be applied (e.g., to apply ±3% accuracy).

At block 410, SOC bounding unit 212 generates $SOC_{Bounded}$ that is set between the upper bound $SOC_{u,bnd}(t)$ and the lower bound $SOC_{l,bnd}(t)$. An exemplary $SOC_{Bounded}$ can be defined as shown in expression (7) below.

$$SOC_{l,bnd}(t) \leq SOC_{Bounded}(t) \leq SOC_{u,bnd}(t) \quad (7)$$

At block 412, controller 118 controls the electrification process of electric vehicle 102 based on $SOC_{Bounded}$. For example, controller 118 can modify the battery cooling or the charge and/or discharge limits, reduce the number of charging and/or discharging cycles, or modify the minimum state-of-charge threshold based on $SOC_{Bounded}$.

Figure 5:
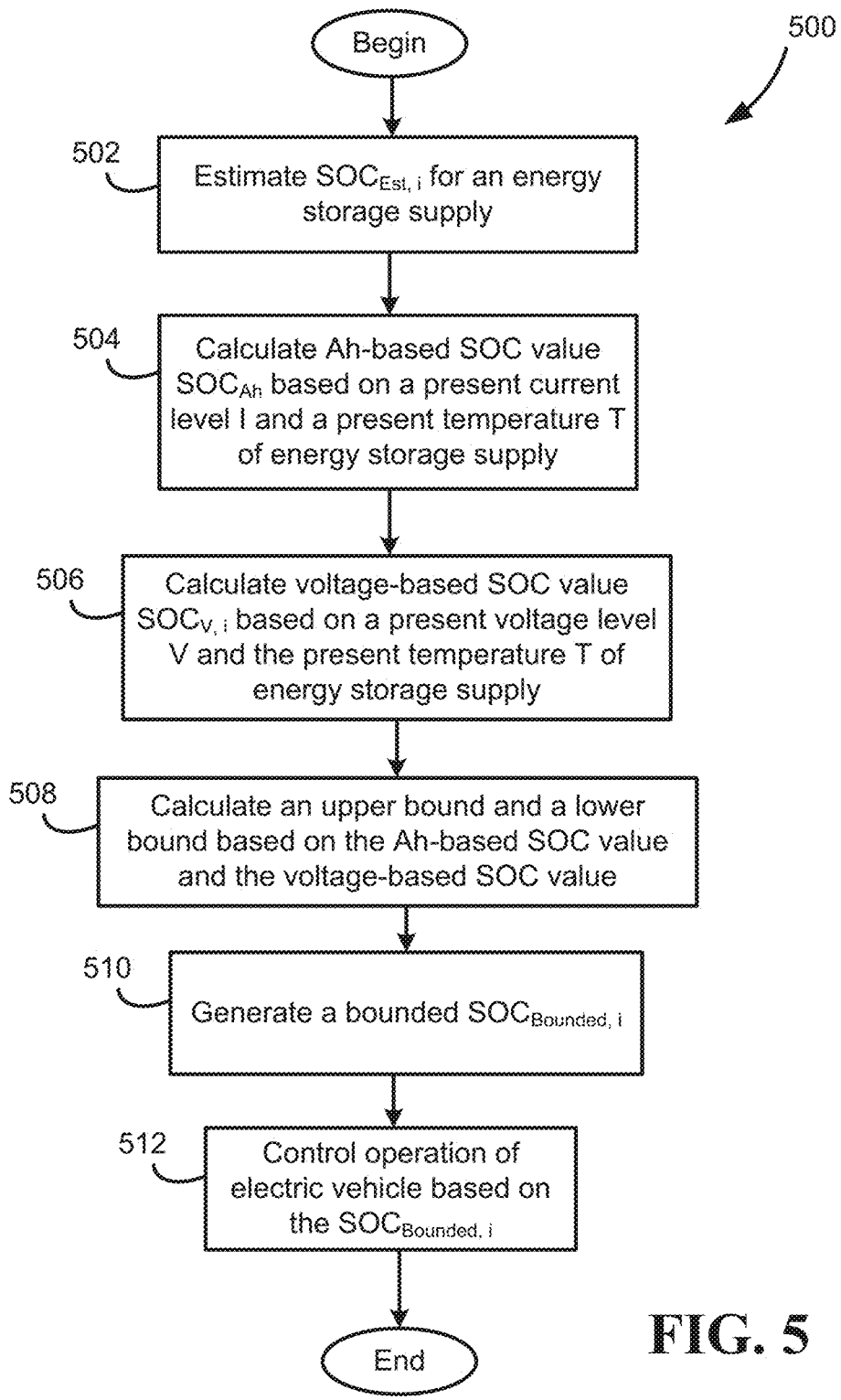
FIG. 5 is a flow chart depicting another exemplary SOC bounding process using the power estimator of FIG. 1 in accordance with embodiments of the present disclosure.

Referring now to FIG. 5, another illustrative SOC bounding process is shown in accordance with embodiments of the subject matter disclosed herein. As disclosed herein, hybrid system 100 is not particularly limited and can perform any of the methods described within the scope of this disclosure. In FIG. 5, a method 500 of performing the SOC bounding process is shown using SOC bounding unit 212. More specifically, when the battery pack is used for energy storage supply 124 (e.g., FIG. 2B), for a predetermined period (e.g., micro time of approximately 1-2 seconds), SOC bounding unit 212 performs one or more steps shown in FIG. 5.

At block 502, SOC estimator 204 estimates $SOC_{Est,i}$ for all cells 124a, 124b, ... 124n in each array i based on the present current level I of energy storage supply 124 and the time-based information. For example, a generic SOC estimator, such as the DKF, can be used to estimate $SOC_{Est,i}$. In one embodiment, for i=1, 2, ... n, n denotes a number of cells or cell groups in series.

At block 504, SOC bounding unit 212 calculates $SOC_{Ah}$ based on the present current level I and a present temperature T of energy storage supply 124. In one example, $SOC_{Ah}$ can be calculated using a coulomb counting technique. An exemplary $SOC_{Ah}$ can be defined as shown in expression (8) below.

$$SOC_{Ah}(t) = SOC_0 - \frac{\int_{t_0}^{t} I(t)dt}{\text{Capacity}} \quad (8)$$

where I(t) is an input current during time t, $SOC_0$ denotes an initial SOC at an initial time of $t_0$, and Capacity denotes a present total capacity generated by energy storage supply 124.

At block 506, SOC bounding unit 212 calculates $SOC_{V,i}$ for all cells 124a, 124b, ... 124n in the battery pack based on the present voltage level V and the present temperature T of energy storage supply 124. An exemplary $SOC_{V,i}$ can be defined as shown in expression (9) below. In one embodiment, $SOC_{V,i}$ can be filtered to remove noises caused by a dynamic voltage response.

$$SOC_{V,i}(t) = [OCV^{-1}(V_i(t)+I(t)R_{0,i})]_{filtered} \quad (9)$$

where OCV is a battery open circuit voltage, which is a function of SOC, denotes a battery internal resistance for each array i, which is dependent on the temperature T. In one example, filtered can be performed using a single-pole low-pass filter. In one embodiment, the single-pole low-pass filter can be used to remove the amplified noise in $SOC_{V,i}$ that may have been caused by the measurement and the imperfect fidelity of the OCV approximation. Other suitable filters are also contemplated to suit different applications. In another example, a linear-phase low-pass filter can be also used to remove the amplification noise.

At block 508, SOC bounding unit 212 calculates an upper bound and a lower bound for $SOC_{Est}$ based on $SOC_{Ah}$ and $SOC_{V,i}$ calculated in blocks 504 and 506, respectively. An exemplary upper bound can be defined as shown in expressions (10) and (12), and an exemplary lower bound can be defined as shown in expressions (11) and (13).

$$SOC_{u,bnd}(t) = \max\{SOC_{Ah}(t), SOC_{V,i}(t)\} + \max\{|SOC_{Ah}(t) - SOC_{V,i}(t)|\} + E_{desg} \quad (10)$$

$$SOC_{l,bnd}(t) = \min\{SOC_{Ah}(t), SOC_{V,i}(t)\} - \max\{|SOC_{Ah}(t) - SOC_{V,i}(t)|\} - E_{desg} \quad (11)$$

$$SOC_{u,bnd}(t) \in [0,1] \quad (12)$$

$$SOC_{l,bnd}(t) \in [0,1] \quad (13)$$

where $E_{desg}$ denotes a predetermined or designed error margin selected by SOC bounding unit 212.

As shown in expressions (10) and (11) above, a maximum value of $SOC_{Ah}$ and $SOC_{V,i}$ can be used as a baseline for the upper bound, but an extra margin can be applied. Also, a minimum value of $SOC_{Ah}$ and $SOC_{V,i}$ can be used as a baseline for the lower bound, then the extra margin can be applied. For example, an abstract value between $SOC_{Ah}$ and $SOC_{V,i}$ can be used as the extra margin by considering the errors/noises in a current sensor and/or a voltage sensor and modeling other errors from the measured voltage shown in expression (9) (e.g., OCV calculated as a function of SOC). As such, the maximum value of $\max\{|SOC_{Ah}-SOC_{V,i}|\}$ can represent a degree of uncertainty in measurements and/or the model used for the SOC bounding process. In some embodiments, an additional accuracy margin, such as $E_{desg}$, can be applied (e.g., to apply ±3% accuracy).

At block 510, SOC bounding unit 212 generates $SOC_{Bounded}$ that is set between the upper bound $SOC_{u,bnd}(t)$ and the lower bound $SOC_{l,bnd}(t)$. An $SOC_{Bounded}$ can be defined as shown in expression (14) below.

$$SOC_{l,bnd}(t) \leq SOC_{Bounded,i}(t) \leq SOC_{u,bnd}(t) \quad (14)$$

At block 512, controller 118 controls the electrification process of electric vehicle 102 based on $SOC_{Bounded,\,i}$. For example, controller 118 can modify the battery cooling or the charge and/or discharge limits, reduce the number of charging and/or discharging cycles, or modify the minimum state-of-charge threshold based on $SOC_{Bounded,\,i}$.

Figure 6:
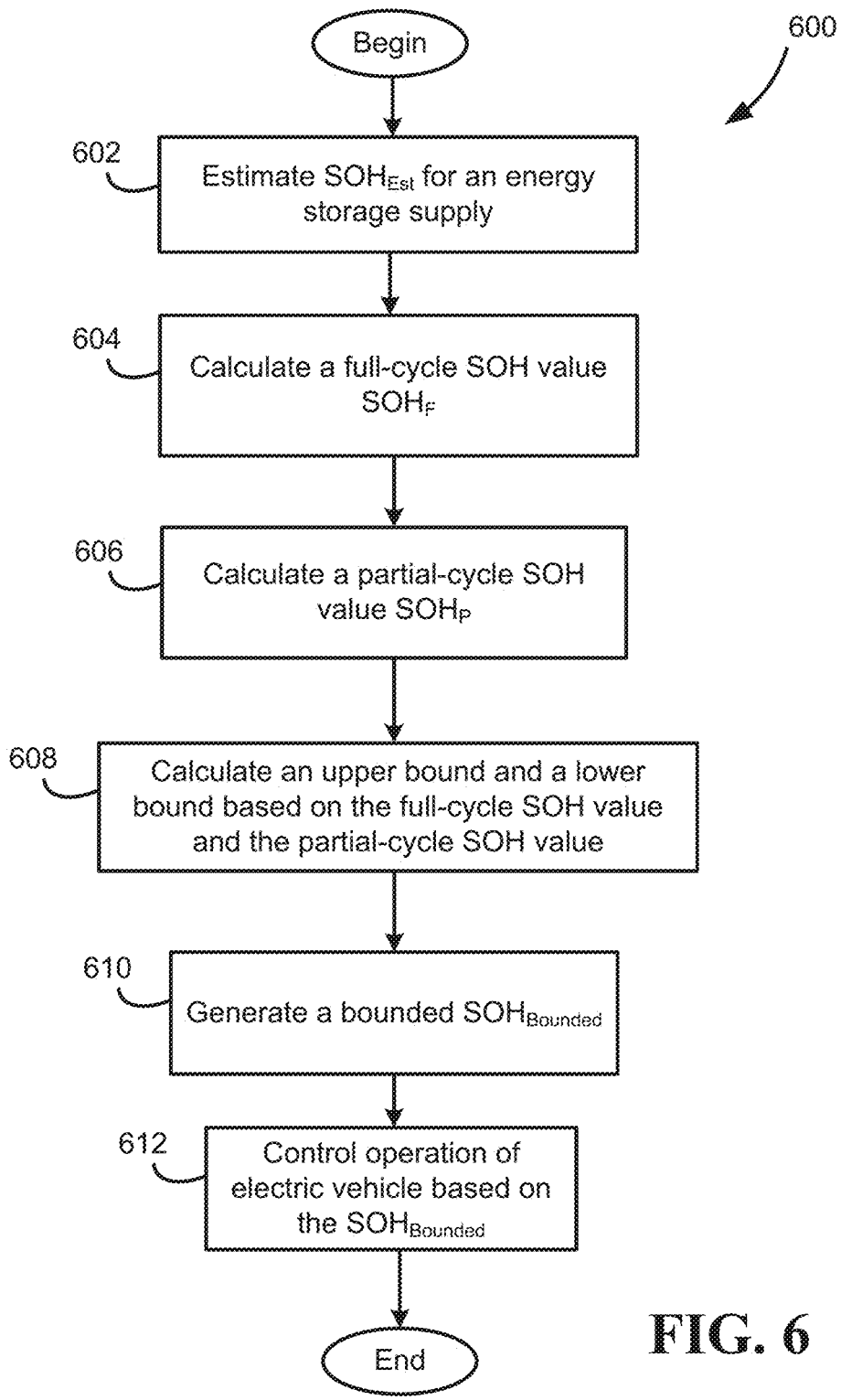
FIG. 6 is a flow chart depicting an exemplary SOH bounding process using the power estimator of FIG. 1 in accordance with embodiments of the present disclosure.

Referring now to FIG. 6, an illustrative SOH bounding process is shown in accordance with embodiments of the subject matter disclosed herein. As disclosed herein, hybrid system 100 is not particularly limited and can perform any of the methods described within the scope of this disclosure. In FIG. 6, a method 600 of performing the SOH bounding process is shown using SOH bounding unit 214. More specifically, when the single battery is used for energy storage supply 124 (e.g., FIG. 2A), for a predetermined period (e.g., macro time of approximately 1-2 months), SOH bounding unit 214 performs one or more steps shown in FIG. 6.

At block 602, SOH estimator 208 estimates $SOH_{Est}$ based on the time-based information. For example, a generic SOC estimator, such as the DKF, can be used to estimate $SOH_{Est}$.

At block 604, SOH bounding unit 214 calculates $SOH_F$ based on a starting time and an ending time associated with energy storage supply 124. $SOH_F$ can be stored in memory 120 for subsequent retrieval and processing. For example, a full-cycle SOH value represents the SOH value $SOH_F(L)$ estimated at the last capacity check for energy storage supply 124. For every n charge cycles or m months, a full charge and discharge is typically recommended for energy storage supply 124. When such full charge and discharge operation is available, an exemplary $SOH_F(L)$ at the last capacity check performing a full charge cycle can be defined as shown in expression (15) below.

$$SOH_F(L) = \frac{\int_{t_{V_{u,lim}}}^{V_{l,lim}} I(t)dt}{\text{Nominal Capacity}} \quad (15)$$

where $I(t)$ is an input current during time t, $t_{V_{u,lim}}$ denotes a starting time at an upper voltage limit of energy storage supply 124 during a full discharge, $t_{V_{l,lim}}$ denotes an ending time when the voltage reaches a lower cut-off voltage limit for energy storage supply 124 during the full discharge, and Nominal Capacity denotes a total capacity generated by energy storage supply 124 when energy storage supply 124 is newly installed at 100% SOH.

However, when such full charge and discharge operation is unavailable or not allowed for certain applications, another exemplary full-cycle SOH value $SOH_F(L)$ can be defined as shown in expression (16) below.

$$SOH_F(L) = \frac{\int_{t_{V_{low}}}^{V_{u,lim}} I(t)dt}{|100\% - SOC(t_{V_{low}})| \text{Nominal Capacity}} \quad (16)$$

where $I(t)$ is an input current during time t, $t_{V_{low}}$ denotes a starting time when an SOC value of energy storage supply 124 is less than approximately 20% before a full charge, $t_{V_{u,lim}}$ denotes an ending time when the voltage reaches an upper voltage limit during the full charge, and Nominal Capacity denotes a total capacity generated by energy storage supply 124 when energy storage supply 124 is newly installed at 100% SOH. In embodiments, the exemplary full-cycle SOH value $SOH_F(L)$ shown in expression (16) can be calculated when (1) an SOC value of energy storage supply 124 is less than 20% after the last operation of electric vehicle 102, (2) a following charge event fully charges energy storage supply 124 to an upper voltage limit (e.g., SOC=100%), and (3) a temperature of energy storage supply 124 is approximately between 25 and 35 degree Celsius (25-35° C.).

At block 606, SOH bounding unit 214 calculates a partial-cycle SOH value $SOH_P$ based on a starting time and an ending time associated with energy storage supply 124. $SOH_P$ can also be stored in memory 120 for subsequent retrieval and processing. For example, the partial-cycle SOH value represents the SOH value $SOH_P(L)$ estimated at the last capacity check for energy storage supply 124. An exemplary $SOH_P(L)$ at the last capacity check performing a partial charge cycle can be defined as shown in expression (17) below.

$$SOH_P(L) = \frac{\int_{t_1}^{t_2} I(t)dt}{|SOC(t_1) - SOC(t_2)| \cdot \text{Nominal Capacity}} \quad (17)$$

where $t_1$ denotes a starting time of the partial cycle and $t_2$ denotes an ending time of the partial cycle.

At block 608, SOH bounding unit 214 calculates an upper bound and a lower bound for $SOH_{Est}$ based on $SOH_F(L)$ and $SOH_P(L)$ calculated in blocks 604 and 606, respectively. An exemplary upper bound can be defined as shown in expressions (18) and (20), and an exemplary lower bound can be defined as shown in expressions (19) and (21).

$$SOH_{u,bnd}(L) = \max\{SOH_F(L), SOH_P(L)\} + |SOH_F(L) - SOH_P(L)| + E_{desg} \quad (18)$$

$$SOH_{l,bnd}(L) = \min\{SOH_F(L), SOH_P(L)\} - |SOH_F(L) - SOH_P(L)| + E_{desg} \quad (19)$$

$$SOH_{u,bnd}(L) \in [0,1] \qquad (20)$$

$$SOH_{l,bnd}(L) \in [0,1] \qquad (21)$$

where $E_{desg}$ denotes a predetermined or designed error margin selected by SOH bounding unit 214.

As shown in expressions (18) and (19) above, a maximum value of $SOH_F$ and $SOH_P$ can be used as a baseline for the upper bound, but an extra margin can be applied. Also, a minimum value of $SOH_F$ and $SOH_P$ can be used as a baseline for the lower bound, then the extra margin can be applied. For example, an abstract value between $SOH_F$ and $SOH_P$ can be used as the extra margin by considering the uncertainties in the $SOH_F$ and $SOH_P$ estimation. In certain situations, $SOH_F$ may not be accurate due to unwanted changes during the capacity checks performed every few months. As another example, $SOH_P$ may not be accurate due to unwanted sensor errors, battery hysteresis, and unknown coulombic efficiencies (e.g., a loss of charge due to a passage of time). As such, the abstract value of $|SOH_F(L)-SOH_P(L)|$ can represent a degree of uncertainty in measurements and/or the model used for the SOH bounding process. In some embodiments, an additional accuracy margin, such as $E_{desg}$, can be applied (e.g., to apply ±3% accuracy).

At block 610, SOH bounding unit 214 generates $SOH_{Bounded}$ that is set between the upper bound $SOH_{u,bnd}(L)$ and the lower bound $SOH_{l,bnd}(L)$. An exemplary $SOH_{Bounded}$ can be defined as shown in expression (22) below.

$$SOH_{l,bnd}(L) \leq SOH_{Bounded}(L) \leq SOH_{u,bnd}(L) \qquad (22)$$

At block 612, controller 118 controls the electrification process of electric vehicle 102 based on $SOH_{Bounded}$. For example, controller 118 can modify the battery cooling or the charge and/or discharge limits, reduce the number of charging and/or discharging cycles, or modify the minimum state-of-charge threshold based on $SOH_{Bounded}$.

Figure 7:
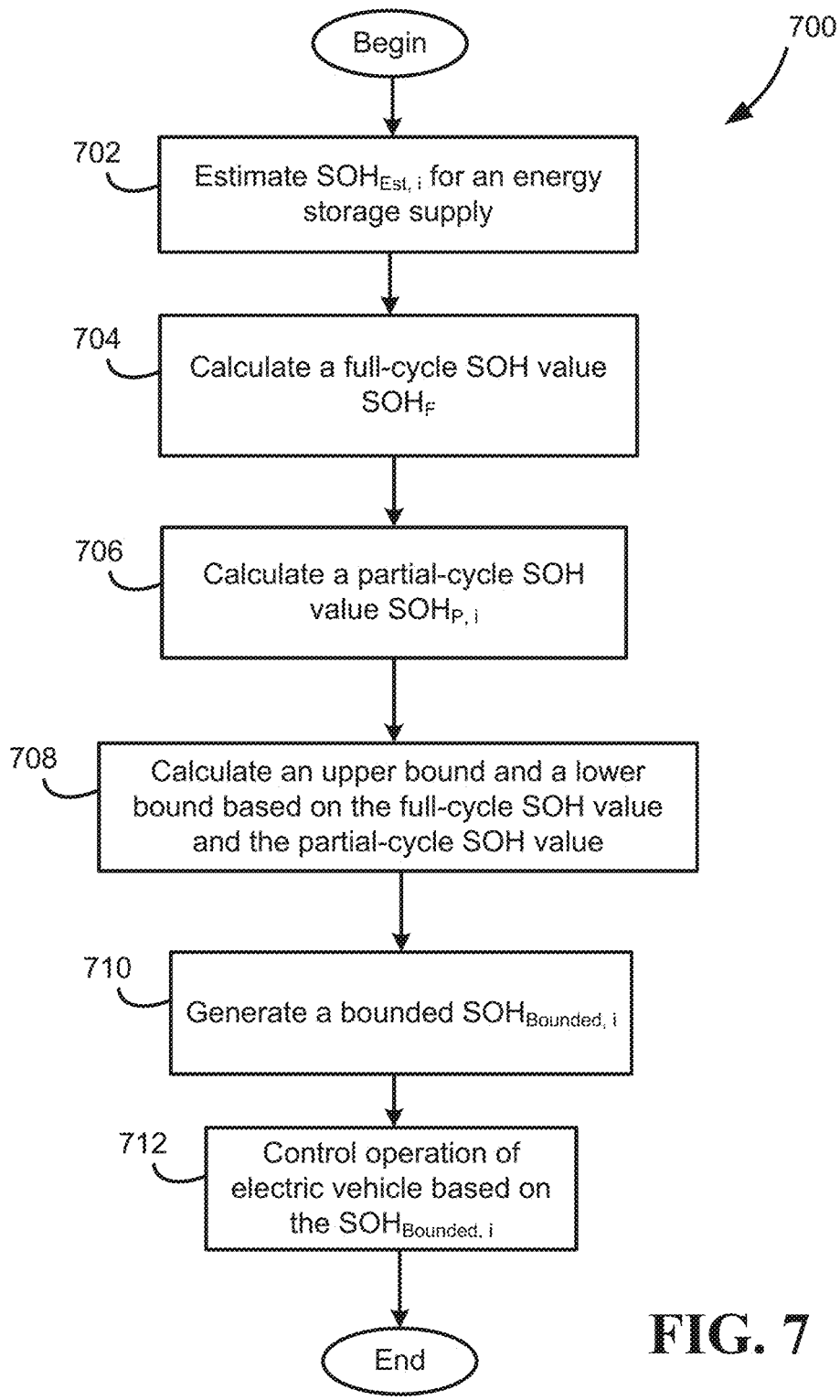
FIG. 7 is a flow chart depicting another exemplary SOH bounding process using the power estimator of FIG. 1 in accordance with embodiments of the present disclosure.

Referring now to FIG. 7, another illustrative SOH bounding process is shown in accordance with embodiments of the subject matter disclosed herein. As disclosed herein, hybrid system 100 is not particularly limited and can perform any of the methods described within the scope of this disclosure. In FIG. 7, a method 700 of performing the SOH bounding process is shown using SOH bounding unit 214. More specifically, when the battery pack is used for energy storage supply 124 (e.g., FIG. 2B), for a predetermined period (e.g., macro time of approximately 1-2 months), SOH bounding unit 214 performs one or more steps shown in FIG. 7.

At block 702, SOH estimator 208 estimates $SOH_{Est,i}$ based on the time-based information. For example, a generic SOC/SOH estimator, such as the DKF, can be used to estimate $SOH_{Est,i}$.

At block 704, SOH bounding unit 214 calculates a full-cycle SOH value $SOH_F$ for the battery pack based on a starting time and an ending time associated with energy storage supply 124. $SOH_F$ can be stored in memory 120 for subsequent retrieval and processing. For example, the full-cycle SOH value represents the SOH value $SOH_F(L)$ estimated at the last capacity check for energy storage supply 124. For every n charge cycles or m months, a full charge and discharge is typically recommended for energy storage supply 124. When such full charge and discharge operation is available, an exemplary $SOH_F(L)$ at the last capacity check performing a full charge cycle can be defined as shown in expression (23) below.

$$SOH_F(L) = \frac{\int_{t_{V_{u,lim}}}^{t_{V_{l,lim}}} I(t)dt}{\text{Nominal Capacity}} \qquad (23)$$

where $I(t)$ is an input current during time t, $t_{V_{u,lim}}$ denotes a starting time at an upper voltage limit of energy storage supply 124 during a full discharge, $t_{V_{l,lim}}$ denotes an ending time when the voltage reaches a lower cut-off voltage limit for energy storage supply 124 during the full discharge, and Nominal Capacity denotes a total capacity generated by energy storage supply 124 when energy storage supply 124 is newly installed at 100% SOH.

However, when such full charge and discharge operation is unavailable or not allowed for certain applications, another exemplary full-cycle SOH value $SOH_F(L)$ can be defined as shown in expression (24) below.

$$SOH_F(L) = \frac{\int_{t_{V_{low}}}^{t_{V_{u,lim}}} I(t)dt}{|100\% - SOC(t_{V_{low}})| \text{Nominal Capacity}} \qquad (24)$$

where $I(t)$ is an input current during time t, $t_{V_{low}}$ denotes a starting time when an SOC value of energy storage supply 124 is less than 20% during a full charge, $t_{V_{u,lim}}$ denotes an ending time when the voltage reaches an upper voltage limit during the full charge, and Nominal Capacity denotes a total capacity generated by energy storage supply 124 when energy storage supply 124 is newly installed at 100% SOH. In embodiments, the exemplary $SOH_F(L)$ shown in expression (24) can be calculated when (1) an SOC value of energy storage supply 124 is less than 20% after the last operation of electric vehicle 102, (2) a following charge event fully charges energy storage supply 124 to an upper voltage limit (e.g., SOC=100%), and (3) a temperature of energy storage supply 124 is approximately between 25 and 35 degree Celsius (25-35° C.).

At block 706, SOH bounding unit 214 calculates a partial-cycle SOH value $SOH_{P,i}$ based on a starting time and an ending time associated with energy storage supply 124. $SOH_{P,i}$ can also be stored in memory 120 for subsequent retrieval and processing. For example, the partial-cycle SOH value represents the SOH value $SOH_{P,i}(L)$ estimated at the last capacity check for energy storage supply 124. An exemplary $SOH_{P,i}(L)$ at the last capacity check performing a partial charge cycle can be defined as shown in expression (25) below.

$$SOH_{P,i}(L) = \frac{\int_{t_1}^{t_2} I(t)dt}{|SOC_i(t_1) - SOC_i(t_2)| \cdot \text{Nominal Capacity}} \qquad (25)$$

where $t_1$ denotes a starting time of the partial cycle and $t_2$ denotes an ending time of the partial cycle.

At block 708, SOH bounding unit 214 calculates an upper bound and a lower bound for $SOH_{Est}$ based on $SOH_F(L)$ and $SOH_{P,i}(L)$ calculated in blocks 704 and 706, respectively. An exemplary upper bound can be defined as shown in expressions (26) and (28), and an exemplary lower bound can be defined as shown in expressions (27) and (29).

$$SOH_{u,bnd}(L) = \max\{SOH_F(L), SOH_{P,i}(L)\} + \max\{|SOH_F(L) - SOH_{P,i}(L)|\} + E_{desg} \qquad (26)$$

$$SOH_{l,bnd}(L)=\min\{SOH_F(L),SOH_{P,i}(L)\}-\max\{|SOH_F(L)-SOH_{P,i}(L)|\}-E_{desg} \quad (27)$$

$$SOH_{u,bnd}(L)\in[0,1] \quad (28)$$

$$SOH_{l,bnd}(L)\in[0,1] \quad (29)$$

where $E_{desg}$ denotes a predetermined or designed error margin selected by SOH bounding unit 214.

As shown in expressions (26) and (27) above, a maximum value of $SOH_F$ and $SOH_{P,i}$ can be used as a baseline for the upper bound, but an extra margin can be applied. Also, a minimum value of $SOH_F$ and $SOH_{P,i}$ can be used as a baseline for the lower bound, then the extra margin can be applied. For example, an abstract value between $SOH_F$ and $SOH_{P,i}$ can be used as the extra margin by considering the uncertainties in the $SOH_F$ and $SOH_{P,i}$ estimation. In certain situations, $SOH_F$ may not be accurate due to unwanted changes during the capacity checks performed every few months. As another example, $SOH_{P,i}$ may not be accurate due to unwanted sensor errors, battery hysteresis, and unknown coulombic efficiencies (e.g., a loss of charge due to a passage of time). As such, the maximum value of max $\{|SOH_F(L)-SOH_{P,i}(L)|\}$ can represent a degree of uncertainty in measurements and/or the model used for the SOH bounding process. In some embodiments, an additional accuracy margin, such as $E_{desg}$, can be applied (e.g., to apply ±3% accuracy).

At block 710, SOH bounding unit 214 generates $SOH_{Bounded,i}$ that is set between the upper bound $SOH_{u,bnd}(L)$ and the lower bound $SOH_{l,bnd}(L)$. An exemplary $SOH_{Bounded,i}$ can be defined as shown in expression (30) below.

$$SOH_{l,bnd}(L)\leq SOH_{Bounded,i}(L)\leq SOH_{u,bnd}(L) \quad (30)$$

At block 712, controller 118 controls the electrification process of electric vehicle 102 based on $SOH_{Bounded,i}$. For example, controller 118 can modify the battery cooling or the charge and/or discharge limits, reduce the number of charging and/or discharging cycles, or modify the minimum state-of-charge threshold based on $SOH_{Bounded,i}$.

Figure 8:
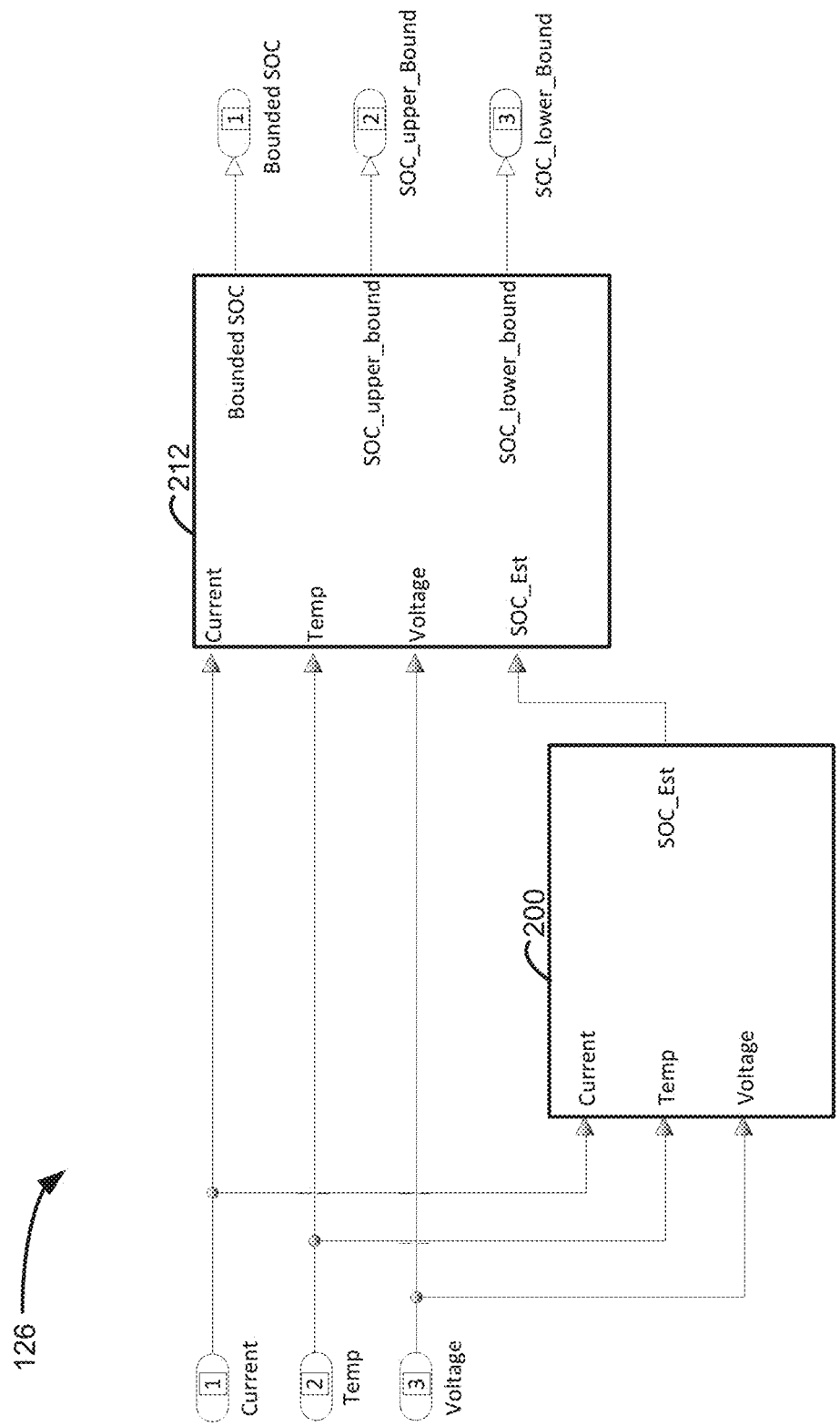
FIG. 8 is another schematic diagram of the power estimator of FIG. 1 in accordance with embodiments of the present disclosure.

Referring now to FIG. 8, another exemplary schematic diagram of power estimator 126 is shown. In the illustrated embodiment, power estimator 126 includes SOC/SOH estimator 200 and SOC bounding unit 212. The illustrated embodiment can be used for both individual battery cells and battery packs to suit different applications. In FIG. 8, SOC/SOH estimator 200 is configured to receive the present current level I and the present voltage level V of energy storage supply 124 from vehicle monitoring unit 128. Further, SOC/SOH estimator 200 is configured to receive the present temperature T of energy storage supply 124 from vehicle monitoring unit 128. SOC/SOH estimator 200 is configured to estimate $SOC_{Est}$ (e.g., 60%) based on the present current level I, the present voltage level V, and the present temperature T of energy storage supply 124. $SOC_{Est}$ is transmitted to SOC bounding unit 212.

SOC bounding unit 212 is configured to receive $SOC_{Est}$ from SOC/SOH estimator 200 and also receive the present current level I, the present voltage level V, and the present temperature T of energy storage supply 124 from vehicle monitoring unit 128. SOC bounding unit 212 is configured to calculate the upper bound and the lower bound that can be applied $SOC_{Est}$ based on the present current level I, the present voltage level V, and the present temperature T, and the $SOC_{Est}$. SOC bounding unit 212 is configured to generate $SOC_{Bounded}$ that is set between the upper bound and the lower bound. SOC bounding unit 212 is configured to output $SOC_{Bounded}$, the upper bound and the lower bound for subsequent processing as desired. For example, controller 118 can control the electrification process of electric vehicle based on $SOC_{Bounded}$.

Figure 9:
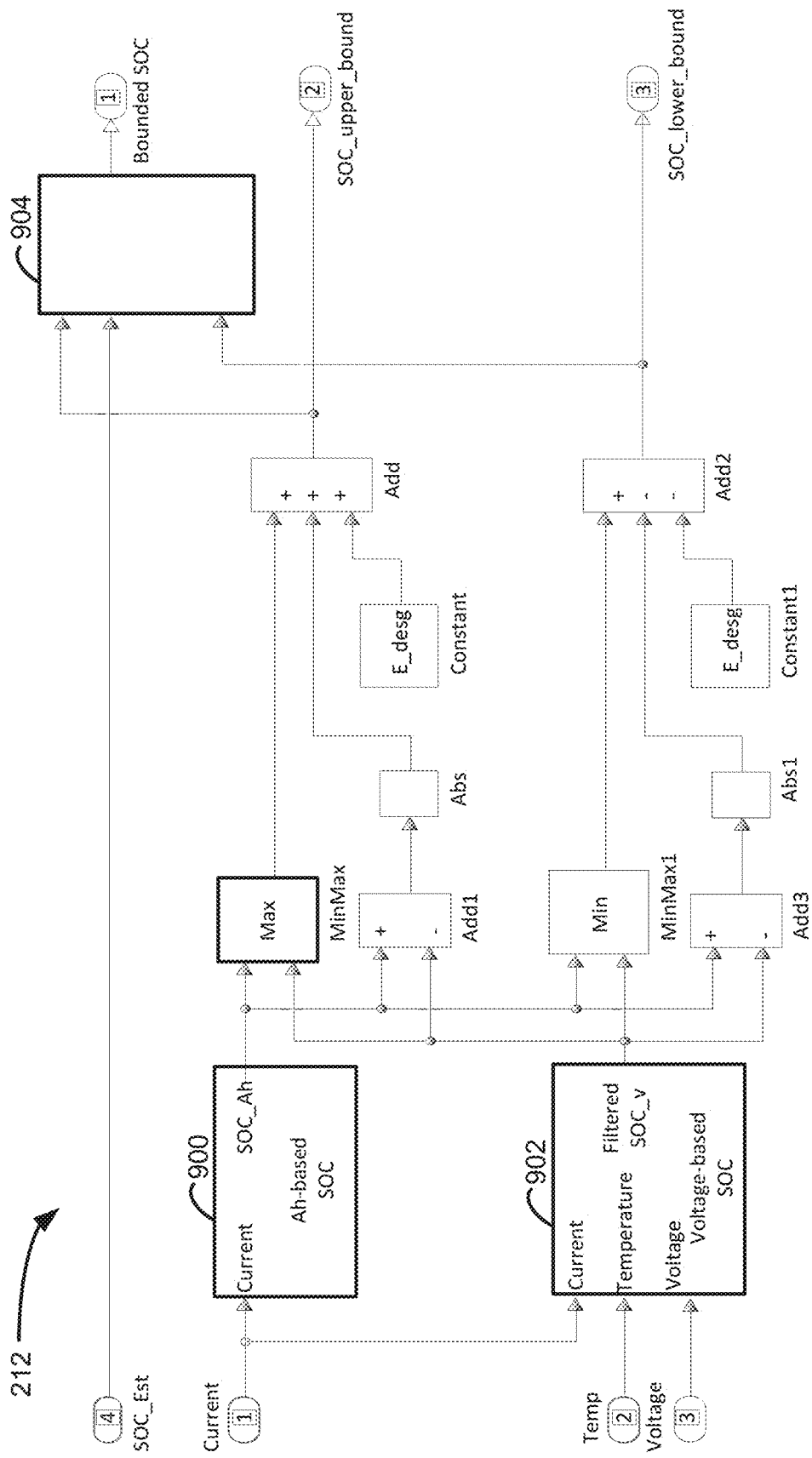
FIG. 9 is a schematic diagram of an SOC bounding unit of the power estimator of FIG. 1 in accordance with embodiments of the present disclosure.

Referring now to FIG. 9, an exemplary schematic diagram of SOC bounding unit 212 shown in FIG. 8. In the illustrated embodiment, SOC bounding unit 212 includes an Ah-based SOC calculation unit 900 and a voltage-based SOC calculating unit 902. Ah-based SOC calculation unit 900 is configured to calculate $SOC_{Ah}$ based on the present current level I of energy storage supply 124. Voltage-based SOC calculating unit 902 is configured to calculate $SOC_V$ based on the present voltage level V, the present temperature T, and the present current level I of energy storage supply 124. $SOC_V$ can be filtered to remove noises using a filter, such as the single-pole low-pass filter.

An exemplary calculation for the upper bound using a MinMax unit, an Add1 unit, an Abs unit, a Constant, and an Add unit is shown below in expression (31) below.

$$SOC_{u,bnd}=\max\{SOC_{Ah},SOC_V\}+|SOC_{Ah}-SOC_V|+E_{desg} \quad (31)$$

An exemplary calculation for the lower bound using a MinMax1 unit, an Add3 unit, an Abs1 unit, a Constant1, and an Add2 unit is shown in expression (32) below.

$$SOC_{l,bnd}=\min\{SOC_{Ah},SOC_V\}-|SOC_{Ah}-SOC_V|-E_{desg} \quad (32)$$

SOC bounding unit 212 further includes a filtering unit 904 configured to receive $SOC_{Est}$, the upper bound and the lower bound. Filtering unit 904 is configured to filter $SOC_{Est}$ using the upper bound and the lower bound, and generate $SOC_{Bounded}$ such that $SOC_{Bounded}$ that is set between the upper bound and the lower bound. SOC bounding unit 212 can output $SOC_{Bounded}$, the upper bound, and the lower bound for subsequent processing as desire.

Although SOC/SOH estimator 200 and SOC bounding unit 212 are shown in FIGS. 8 and 9, other suitable arrangements, such as SOC/SOH estimator 200 and SOH bounding unit 214, are also contemplated to suit different applications.

As indicated above, in embodiments of the present disclosure a controller is provided for performing a power estimation process for an electric vehicle, such as electric vehicle 102 including controller 118 having non-transitory memory 120 and processor 122. Non-transitory memory 120 includes instructions that, in response to execution by processor 122, cause performance of various methods described below, including estimating the inner state of an energy storage supply (e.g., a battery). Example variables of the inner state include SOC and SOH. In some embodiments of the present disclosure, SOC estimations are performed for batteries including battery cells and battery packs. Generally, battery cells and battery packs are used in electric vehicles or hybrid electric vehicles. As such, SOC is an indicator of the remaining charge of the battery system. SOC quantifies the usable energy at the present time and reflects residual range of power. A good knowledge of SOC allows the battery to deliver high performance as needed while ensuring it operates within safe limits. SOC is often not a direct measurement but incorporates an estimation in one way or another.

SOC indicates the equivalent of a fuel gauge for a battery. An estimate of SOC for a battery system is an important input to balancing, energy, and power calculations. Accurate SOC estimates provide benefits such as, for example, longevity, performance, reliability, and/or the like. Estimations usually come with certain errors due to sensing errors and/or model errors. For an SOC estimator, if it is badly calibrated and/or if bad data is fed it, the estimated SOC may be subject to misinterpretation of the true SOC. It is thus critical to define reliable estimation error bounds (e.g., an upper bound of estimated SOC and a lower bound of estimated SOC) in real-time such that estimated SOC will be reliable for its intended use. A BMS based on such reliable SOC estimations ensures the battery will operate safely while the entire pack capacity can be aggressively utilized. Existing methods tend to estimate battery SOC without providing the estimation error bounds. In the absence of the real-time SOC error bounds, the usage of the battery system could be overly conservative, particularly at very high and low SOC ranges, as overcharge and over-discharge usually take place at such conditions with inaccurate SOC information.

Some embodiments of the present disclosure are directed to SOC estimations each with an upper bound and a lower bound, which in cases, the upper and lower bounds are relatively narrow yet reliable. Further, certain embodiments of the present disclosure are directed to systems and methods of determining the upper and lower estimation bounds independently in real-time by combining the current, voltage and temperature measurements. In some cases, by limiting the estimated SOC in upper and lower bounds, the BMS reduces possible divergence of SOC estimation, ensures the battery can operate safely and aggressively such that the entire battery capacity is fully used.

In addition, the SOC upper and lower bounds in the present disclosure could serve for on-board diagnosis for sensors and conventional embedded SOC estimators. Once the upper and/or lower bounds are increasingly enlarged, the BMS may determine that uncertainties in the measurements are increasing and it is time to recalibrate the sensors and/or the SOC estimators. Some embodiments of the present disclosure provide robust battery SOC estimation at various operation conditions throughout the battery lifetime by including SOC upper and lower bounds.

At least some embodiments of the present disclosure are directed to a method for estimating an SOC of a battery. The method includes: receiving a series of current data indicative of measurements of current flowing through the battery; receiving a series of voltage data indicative of measurements of voltages of the battery; calculating an ampere-hour-based SOC estimation (Ah-SOC) using the series of current data; calculating a voltage-based SOC estimation (V-SOC) using the series of voltage data and the series of current data; and generating a bounded SOC estimation comprising an SOC upper bound and an SOC lower bound. The SOC upper bound is determined based on a larger value of the Ah-SOC and V-SOC. The SOC lower bound is determined based on a smaller value of the Ah-SOC and V-SOC.

At least some embodiments of the present disclosure are directed to a method for estimating an SOC of a battery pack having a plurality of battery cells. The method comprises: receiving a series of current data indicative of measurements of current flowing through a battery cell for each battery cell of the plurality of battery cells; receiving a series of voltage data indicative of measurements of voltages of a battery cell for each battery cell of the plurality of battery cells; calculating an ampere-hour-based SOC estimation (Ah-SOC) for each battery cell of the plurality of battery cells using the series of current data for a respective battery cell; calculating a voltage-based SOC estimation (V-SOC) for each battery cell of the plurality of battery cells using the series of voltage data and the series of current data for a respective battery cell; and generating a bounded SOC estimation comprising an SOC upper bound and an SOC lower bound. The SOC upper bound is determined based on values of the Ah-SOC and the V-SOC for the plurality of battery cells. The SOC lower bound is determined based on values of the Ah-SOC and V-SOC for the plurality of battery cells.

Figure 10A:
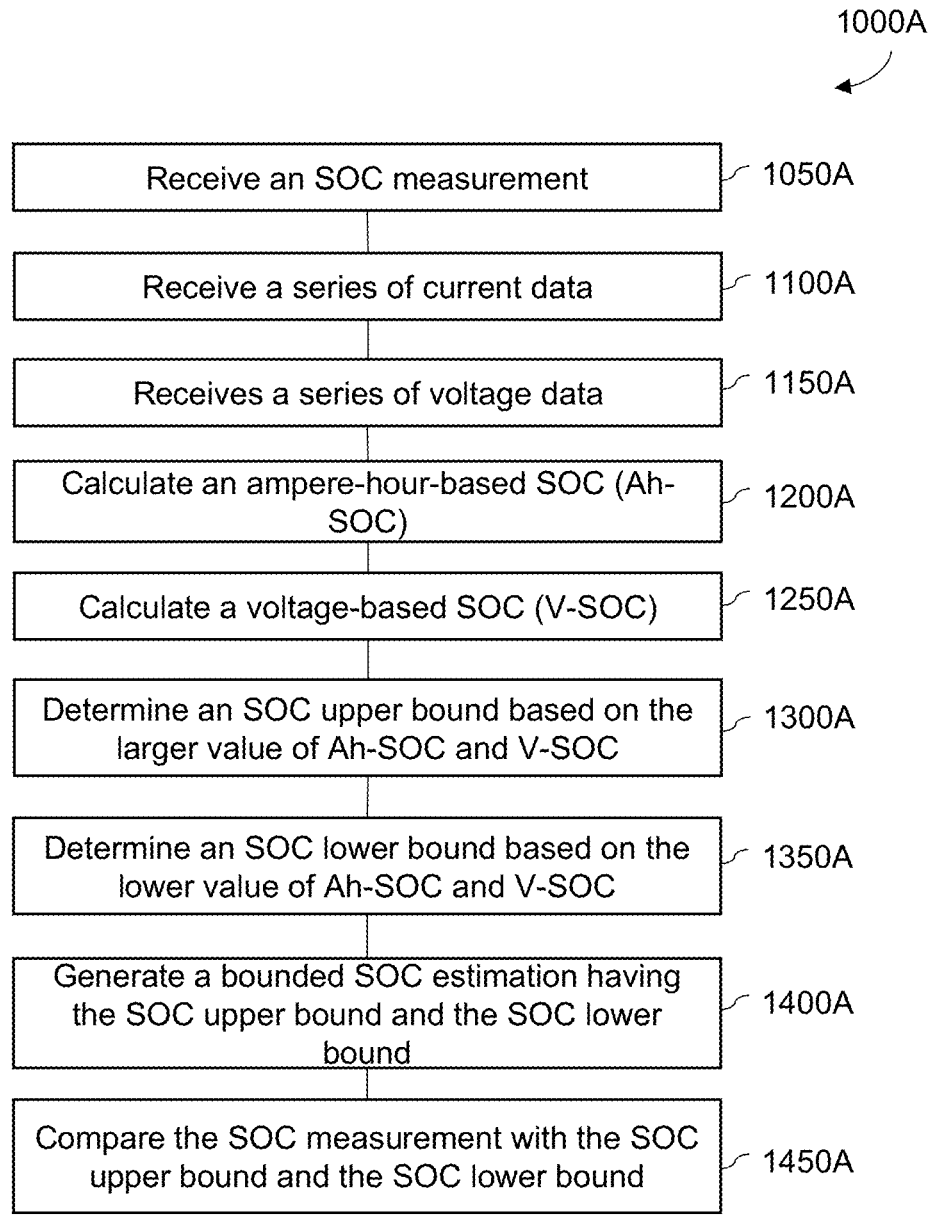
FIG. 10A is a flow chart depicting an exemplary method of estimating an SOC with upper and lower bounds of a battery in accordance with embodiments of the present disclosure.

Referring now to FIG. 10A, an illustrative method 1000A of estimating an SOC with upper and lower bounds of a battery (e.g., a battery cell) is shown in accordance with embodiments of the subject matter disclosed herein. Aspects of embodiments of method 1000A may be performed, for example, by a battery management system, a battery management device, controller 118, and/or an integrated circuit chip. As used herein, a BMS refers to a system, a device, and/or an integrated circuit chip for measuring, estimating, and/or managing usage of a battery (e.g., a battery cell, a battery pack, a cell group, etc.). One or more steps of method 1000A are optional and/or can be modified by one or more steps of other embodiments described herein. Additionally, one or more steps of other embodiments described herein may be added to method 1000A. In some embodiments, the BMS may measure or receive an SOC measurement (1050A). The BMS receives a series of current data for the battery (1100A) and a series of voltage data (1150A). In embodiments, the series of current data and voltage data are collected in real-time. In embodiments, the series of current data and voltage data are collected when the battery is in operation. In some cases, the series of current data and voltage data are associated with time information (e.g., timestamps).

Next, the BMS calculates an ampere-hour-based SOC (Ah-SOC) (1200A) based on the current data. In some embodiments, the Ah-SOC is determined based on at least a part of the series of current data. In one embodiment, the Ah-SOC is calculated based on the integration of at least a part of the series of current data. In some cases, the Ah-SOC is determined based on a capacity of the battery. As used herein, capacity of a battery refers to a measure (e.g., in ampere-hour) of the charge stored in the battery.

Further, the BMS may calculate a voltage-based SOC (V-SOC) (1250A). In some embodiments, the V-SOC is determined based on at least a part of the series of voltage data. In some embodiments, the V-SOC is determined based on at least a part of the series of current data. In some cases, the battery has a known SOC-OCV relationship, where OCV refers to the open-circuit voltage of the battery. In embodiments, the BMS estimates the OCV and determines the V-SOC based on the inverse of SOC-VOC relationship. In some cases, the OCV is estimated using the current measurement at the time and the voltage measurement at the time. In some cases, the OCV is estimated using the internal resistance of the battery as a parameter, where the internal resistance of the battery is varied with temperature. In embodiments, the V-SOC is further determined based on an inverse open-circuit-voltage function. In embodiments, the V-SOC is further determined by applying a filter. In some cases, the filter is a low pass filter.

In embodiments, the BMS determines an SOC upper bound based on a larger value of the Ah-SOC and V-SOC (1300A). In some cases, the SOC upper bound is determined based at least in part on a difference between the Ah-SOC and V-SOC. The difference between the Ah-SOC and V-SOC may indicate sensing errors and/or model errors. In some cases, the SOC upper bound is determined based at least in part on a design accuracy of the battery, for example, to fine tune the estimation. In one embodiment, the SOC upper bound is determined at least partially based on the larger value of the Ah-SOC and V-SOC added by an absolute value of the difference between the Ah-SOC and V-SOC.

In certain embodiments, the BMS determines an SOC lower bound based on a smaller value of the Ah-SOC and V-SOC (1350A). In some cases, the SOC lower bound is determined based at least in part on a difference between the Ah-SOC and V-SOC. In some cases, the SOC lower bound is determined based at least in part on a design accuracy of the battery, for example, to fine tune the estimation. In one embodiment, the SOC lower bound is determined based on the smaller value of the Ah-SOC and V-SOC subtracted by an absolute value of the difference between the Ah-SOC and V-SOC.

In some embodiments, the BMS may generate a bounded SOC estimation having the SOC upper bound and the SOC lower bound (1400A). As used herein, a bounded SOC estimation includes an SOC estimation upper bound and/or an SOC estimation lower bound. In some cases, the BMS may compare the SOC measurement with the SOC upper bound and the SOC lower bound (1450A), for example, to determine a bounded SOC value. In one example, the BMS sets the bounded SOC value to the SOC upper bound if the SOC measurement is greater than the SOC upper bound evaluates. In one example, the BMS sets the bounded SOC value to the SOC lower bound if the SOC measurement is smaller than the SOC lower bound. In some cases, the BMS sets the bounded SOC value to the SOC measurement if the SOC measurement is smaller than or equal to the SOC upper bound and the SOC measurement is greater than or equal to the SOC lower bound. In some cases, the bounded SOC estimation further comprises the bounded SOC value. In some designs, the SOC measurement is received from a conventional SOC measurement device.

Figure 10B:
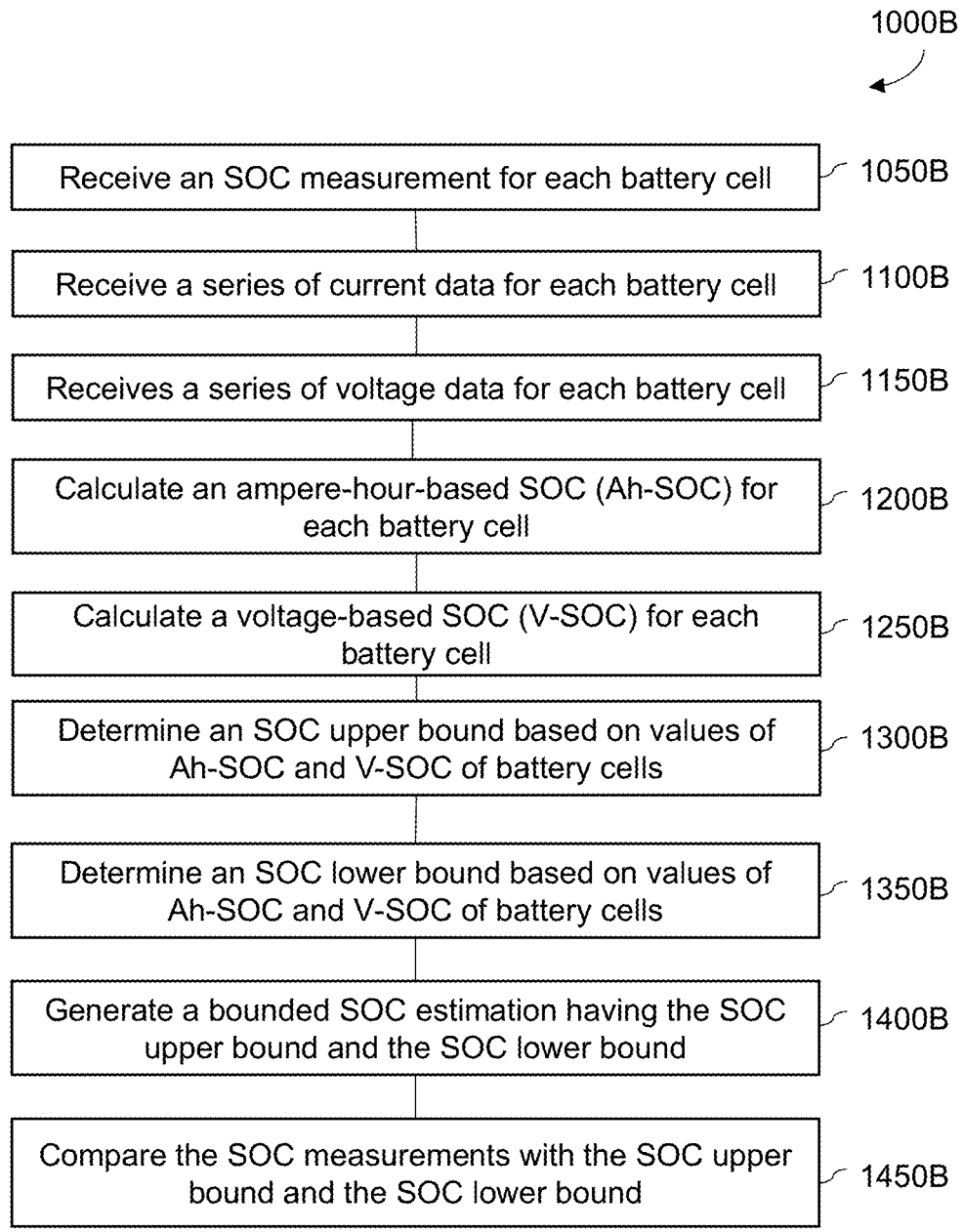
FIG. 10B is a flow chart depicting an exemplary method of estimating an SOC with upper and lower bounds of a battery pack having a plurality of battery cells or cell groups in accordance with embodiments of the present disclosure.

Referring now to FIG. 10B, an illustrative method 1000B of estimating an SOC with upper and lower bounds of a battery pack having a plurality of battery cells or cell groups is shown in accordance with embodiments of the subject matter disclosed herein. Aspects of embodiments of method 1000B may be performed, for example, by a battery management system, a battery management device, and/or an integrated circuit chip. One or more steps of method 1000B are optional and/or can be modified by one or more steps of other embodiments described herein. Additionally, one or more steps of other embodiments described herein may be added to method 1000B. As used herein, a battery cell refers to a single battery cell or a group of battery cells whose electrodes including anodes and cathodes are connected. In some embodiments, the BMS may measure or receive an SOC measurement for each battery cell of the plurality of battery cells (1050B). The BMS receives a series of current data for each battery cell (1100B) and a series of voltage data for each battery cell (1150B). In embodiments, the series of current data and voltage data are collected in real-time. In embodiments, the series of current data and voltage data are collected when the battery pack is in operation. In some cases, the series of current data and voltage data are associated with time information (e.g., timestamps).

Next, the BMS calculates an ampere-hour-based SOC (Ah-SOC) for each battery cell (1200B) based on the current data for the respective battery cell. In some embodiments, the Ah-SOC is determined based on at least a part of the series of current data for the respective battery cell. In one embodiment, the Ah-SOC for a battery cell is calculated based on the integration of at least a part of the series of current data for the respective battery cell. In some cases, the Ah-SOC for a battery cell is determined based on a capacity of the respective battery cell. In some cases, the capacity of a battery cell is represented by an integration of current over time from when the SOC is 0 to when the SOC is 1.

Further, the BMS may calculate a voltage-based SOC (V-SOC) for each battery cell (1250B). In some embodiments, the V-SOC of a battery cell is determined based on at least a part of the series of voltage data for the respective battery cell. In some embodiments, the V-SOC is determined based on at least a part of the series of current data. In some cases, the battery cell has a known SOC-OCV relationship, where OCV refers to the open-circuit voltage of the battery. In embodiments, the BMS estimates the OCV and determines the V-SOC for a battery cell based on the inverse of SOC-VOC relationship. In some cases, the OCV is estimated using the current measurement at the time and the voltage measurement at the time. In some cases, the OCV is estimated using the internal resistance of the battery as a parameter, where the internal resistance of the battery is varied with temperature. In some cases, temperature data is received by the BMS and used to calculate the internal resistance of the battery. In embodiments, the V-SOC is further determined based on an inverse open-circuit-voltage function. In embodiments, the V-SOC is further determined by applying a filter. In some cases, the filter is a low pass filter.

In embodiments, the BMS determines an SOC upper bound based on values of the Ah-SOC and V-SOC of battery cells in the battery pack (1300B). In some cases, the SOC upper bound is determined based on the maximum value of the Ah-SOC and V-SOC of battery cells in the battery pack. In some cases, the SOC upper bound is determined based at least in part on differences between the Ah-SOC and V-SOC of battery cells. In one embodiment, the SOC upper bound is determined based at least in part on the largest difference value between the Ah-SOC and V-SOC of the absolute difference values between the Ah-SOC and V-SOC for all battery cells respectively. In some cases, the SOC upper bound is determined based at least in part on a design accuracy of the battery, for example, to fine tune the estimation. In one embodiment, the SOC upper bound is determined at least partially based on the maximum value of the Ah-SOC and V-SOC of battery cells in the battery pack plus the maximum absolute value of the differences between the Ah-SOC and V-SOC for battery cells respectively.

In certain embodiments, the BMS determines an SOC lower bound based on values of the Ah-SOC and V-SOC of battery cells in the battery pack (1350B). In some cases, the SOC lower bound is determined based on the minimum value of the Ah-SOC and V-SOC of battery cells in the battery pack. In some cases, the SOC lower bound is determined based at least in part on differences between the Ah-SOC and V-SOC of battery cells. In some cases, the SOC lower bound is determined based at least in part on a design accuracy of the battery, for example, to fine tune the estimation. In one embodiment, the SOC lower bound is determined based on the minimum value of the Ah-SOC and V-SOC battery cells in the battery pack minus the maximum absolute value of the differences between the Ah-SOC and V-SOC for battery cells respectively.

In some embodiments, the BMS may generate a bounded SOC estimation having the SOC upper bound and the SOC lower bound (1400B). In some cases, the BMS may compare the SOC measurements for battery cells with the SOC upper bound and the SOC lower bound (1450B), for example, to determine bounded SOC values. In one example, the BMS sets the bounded SOC value to the SOC upper bound if the corresponding SOC measurement is greater than the SOC upper bound evaluates. In one example, the BMS sets the bounded SOC value to the SOC lower bound if the corresponding SOC measurement is smaller than the SOC lower bound. In some cases, the BMS sets the bounded SOC value to the corresponding SOC measurement if the corresponding SOC measurement is smaller than or equal to the SOC upper bound and the corresponding SOC measurement is greater than or equal to the SOC lower bound. In some cases, the bounded SOC estimation further comprises the bounded SOC values. In some designs, the SOC measurement is received from a conventional SOC measurement device.

Figure 11A:
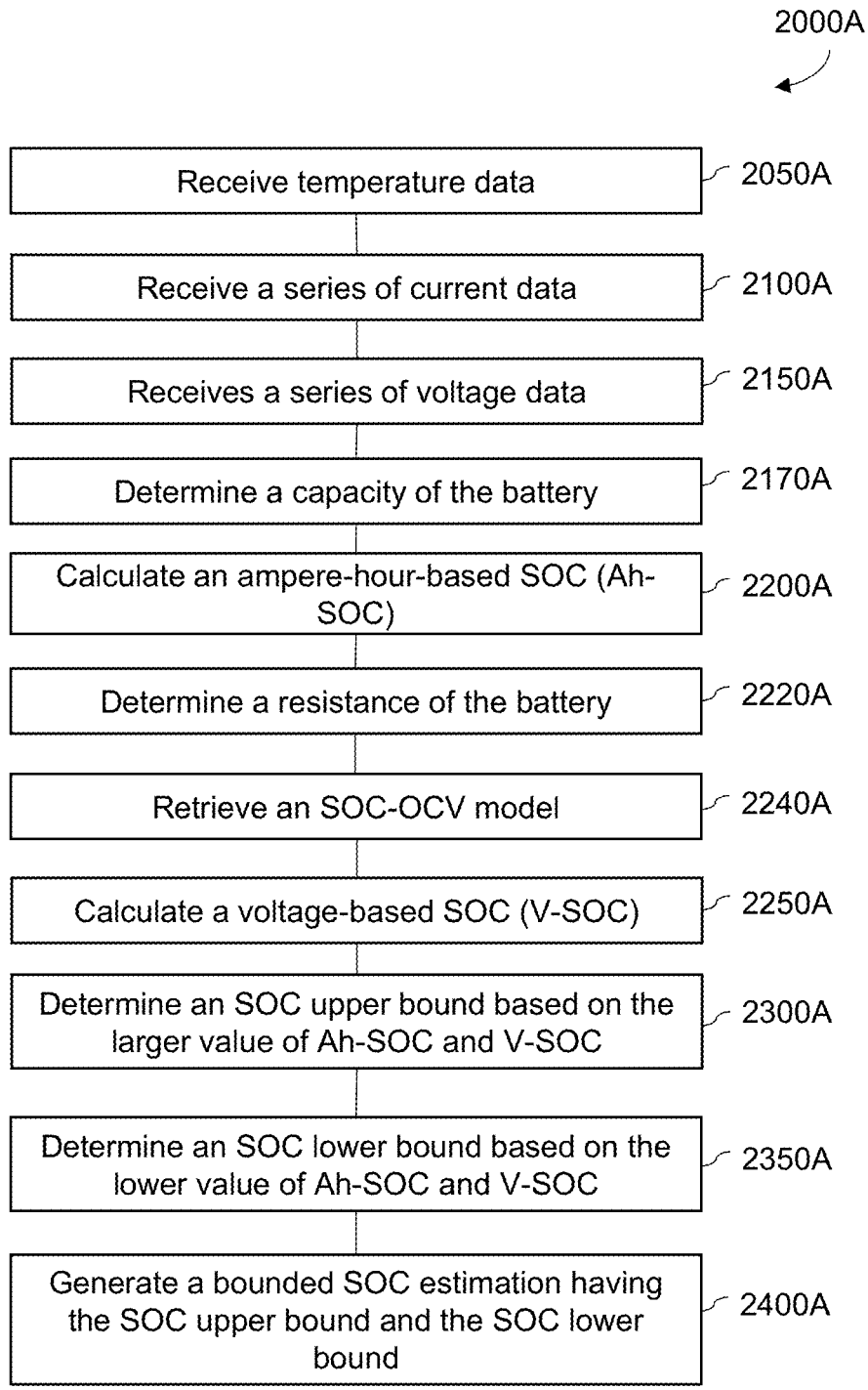
FIG. 11A is a flow chart depicting an exemplary method of generating a bounded SOC estimation for a battery (e.g., a battery cell) in accordance with embodiments of the present disclosure.

Referring now to FIG. 11A, an illustrative method 2000A of generating a bounded SOC estimation for a battery (e.g., a battery cell) is shown in accordance with embodiments of the subject matter disclosed herein. Aspects of embodiments of method 2000A may be performed by a BMS. One or more steps of method 2000A are optional and/or can be modified by one or more steps of other embodiments described herein. Additionally, one or more steps of other embodiments described herein may be added to method 2000A. In some embodiments, the BMS may measure or receive temperature data (2050A). The BMS receives or measures a series of current data for the battery (2100A) and a series of voltage data for the battery (2150A). In embodiments, the series of current data and voltage data are collected in real-time. In embodiments, the series of current data and voltage data are collected when the battery is in operation. In some cases, the series of current data and voltage data are associated with time information (e.g., timestamps).

Next, the BMS determines the capacity of the battery (2170A). In one embodiment, the capacity is determined by integrating the current (I) over time (t). In one embodiment, the capacity of the battery and/or battery cell is calculated using expression (33) below.

$$\text{Capacity} = \int_{SOC=0}^{SOC=1} I(t)dt \qquad (33)$$

where Capacity is the integration of the current (I) from the time of SOC=0 to the time SOC=1.

In embodiments, the BMS calculates an ampere-hour-based SOC (Ah-SOC) (2200A). In some cases, the Ah-SOC is determined based on the current data. In some embodiments, the Ah-SOC is determined based on at least a part of the series of current data. In one embodiment, the Ah-SOC is calculated based on the integration of at least a part of the series of current data. In some cases, the Ah-SOC is determined based on a capacity of the battery. In one case, an Ah-SOC of a battery and/or a battery cell at time t can be estimated using expression (34) below.

$$SOC_{Ah}(t) = SOC_0 - \frac{\int_{t_0}^{t} I(t)dt}{\text{Capacity}} \qquad (34)$$

where $SOC_{Ah}(t)$ is an Ah-SOC at time t, $SOC_0$ is an SOC estimate at $t_0$, I(t) is the measured current data over time, and Capacity is the capacity of the battery and/or battery cell.

Figure 14:
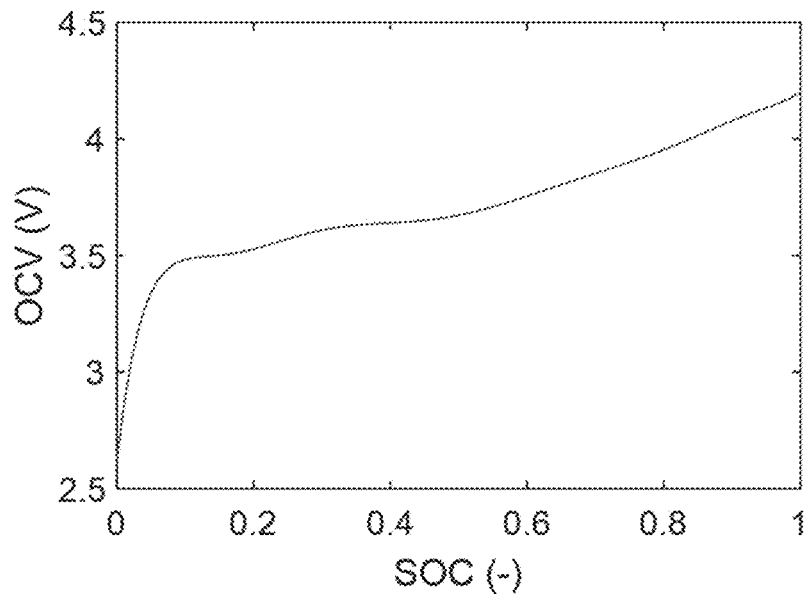
FIG. 14 illustrates an example of an SOC-OCV model/or function in accordance with embodiments of the present disclosure.

Further, the BMS may determine a resistance of the battery (2220A). The resistance of the battery is often affected by temperature. In some embodiments, the BMS may retrieve an SOC-OCV model (2240A), where OCV is the open-circuit voltage. In embodiments, the SOC-OCV model represents a non-linear relationship. FIG. 14 shows an example of an SOC-OCV model/or function. In this example, the SOC and OCV has a non-linear relationship. In some cases, the SOC-OCV model is affected by temperature, such that the BMS retrieves or selects the SOC-OCV model according to the temperature at the time of the SOC estimation.

In some embodiments, the BMS may calculate a voltage-based SOC (V-SOC) (2250A), for example, based on a number of parameters listed above. In some embodiments, the V-SOC is determined based on at least a part of the series of voltage data. In some embodiments, the V-SOC is determined based on at least a part of the series of current data. In embodiments, the BMS estimates the OCV and determines the V-SOC based on the inverse of SOC-VOC relationship. In some cases, the OCV is estimated using the current measurement at the time and the voltage measurement at the time. In some cases, the OCV is estimated using the internal resistance of the battery as a parameter, where the internal resistance of the battery is varied with temperature. In embodiments, the V-SOC is further determined based on an inverse open-circuit-voltage function. In embodiments, the V-SOC is further determined by applying a filter.

In one case, a V-SOC of a battery and/or a battery cell can be estimated using expression (35) below.

$$SOC_V(t) = f(OCV^{-1}(V(t) + I(t)R_0(T))) \qquad (35)$$

where $SOC_V(t)$ is a V-SOC at time t, f( ) is a filter function, $OCV^{-1}(\ )$ is an inverse SOC-OCV function, V(t) is the measured current data at time t, $I(t)$ is the measured current data at time t, and $R_0(T)$ is an estimated resistance of the battery based on the measured temperature T. In one embodiment, the filter is a low pass filter.

In embodiments, the BMS determines an SOC upper bound based on a larger value of the Ah-SOC and V-SOC (2300A). In some cases, the SOC upper bound is determined based at least in part on a difference between the Ah-SOC and V-SOC. The difference between the Ah-SOC and V-SOC may indicate sensing errors and/or model errors. In some cases, the SOC upper bound is determined based at least in part on a design accuracy of the battery, for example, to fine tune the estimation. In one embodiment, the SOC upper bound is determined at least partially based on the larger value of the Ah-SOC and V-SOC added by an absolute value of the difference between the Ah-SOC and V-SOC.

In one case, an upper bound of an SOC estimation at time t for a battery and/or a battery cell can be determined using expression (36) below.

$$SOC_{Ubnd}(t) = \max\{SOC_{Ah}(t), SOC_V(t)\} + |SOC_{Ah}(t) - SOC_V(t)| + E \qquad (36)$$

where $SOC_{Ubnd}(t)$ is an upper bound of the SOC estimation at time t, $SOC_{Ah}(t)$ is an Ah-SOC at time t, $SOC_V(t)$ is a V-SOC at time t, and E is an estimated design accuracy (e.g., 3%). In some cases, the $|SOC_{Ah}(t) - SOC_V(t)|$ may be an indication of sensing errors and/or model errors.

In certain embodiments, the BMS determines an SOC lower bound based on a smaller value of the Ah-SOC and V-SOC (2350A). In some cases, the SOC lower bound is determined based at least in part on a difference between the Ah-SOC and V-SOC. In some cases, the SOC lower bound is determined based at least in part on a design accuracy of the battery, for example, to fine tune the estimation. In one embodiment, the SOC lower bound is determined based on the smaller value of the Ah-SOC and V-SOC subtracted by an absolute value of the difference between the Ah-SOC and V-SOC.

In one case, a lower bound of an SOC estimation at time t for a battery and/or a battery cell can be determined using expression (37) below.

$$SOC_{Lbnd}(t) = \min\{SOC_{Ah}(t), SOC_V(t)\} - |SOC_{Ah}(t) - SOC_V(t)| - E \qquad (37)$$

where $SOC_{Lbnd}(t)$ is a lower bound of the SOC estimation at time t, $SOC_{Ah}(t)$ is an Ah-SOC at time t, $SOC_V(t)$ is a V-SOC at time t, and E is an estimated design accuracy (e.g., 3%). In some cases, the |SOC$_{Ah}$(t)−SOC$_V$(t)| may be an indication of sensing errors and/or model errors.

In some embodiments, the BMS may generate a bounded SOC estimation having the SOC upper bound and the SOC lower bound (2400A). In some cases, the BMS may compare SOC measurements with the SOC upper bound and the SOC lower bound in operation, for example, to determine a bounded SOC value. In one example, the BMS sets the bounded SOC value to the SOC upper bound if the SOC measurement is greater than the SOC upper bound evaluates. In one example, the BMS sets the bounded SOC value to the SOC lower bound if the SOC measurement is smaller than the SOC lower bound. In some cases, the BMS sets the bounded SOC value to the SOC measurement if the SOC measurement is smaller than or equal to the SOC upper bound and the SOC measurement is greater than or equal to the SOC lower bound. In some cases, the bounded SOC estimation further comprises the bounded SOC value. In some designs, the SOC measurement is received from a conventional SOC measurement device.

Figure 11B:
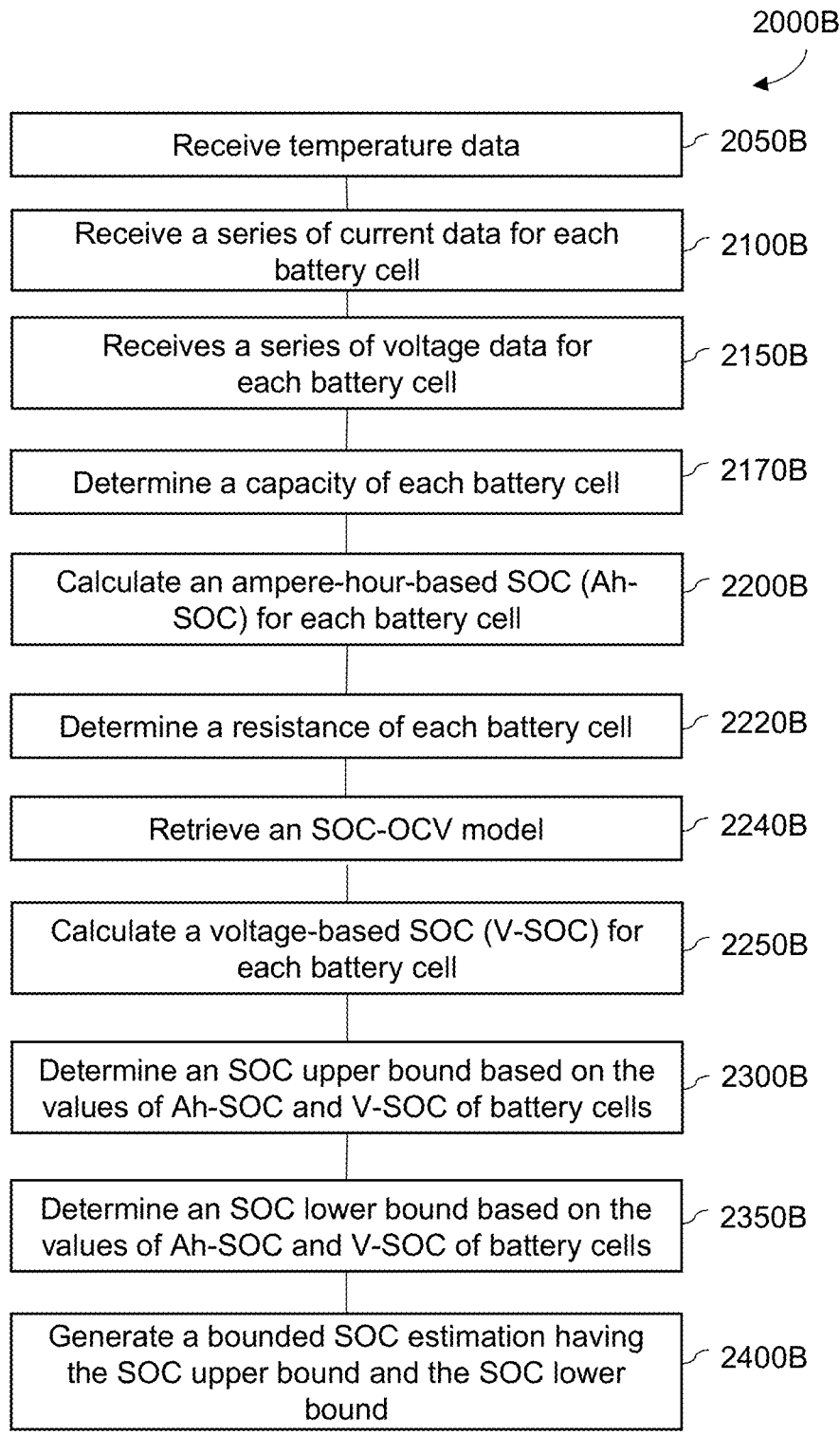
FIG. 11B is a flow chart depicting an exemplary method of generating a bounded SOC estimation of a battery pack having a plurality of battery cells or cell groups in accordance with embodiments of the present disclosure.

Referring now to FIG. 11B, an illustrative method 2000B of generating a bounded SOC estimation of a battery pack having a plurality of battery cells or cell groups is shown in accordance with embodiments of the subject matter disclosed herein. Aspects of embodiments of method 2000B may be performed, for example, by a battery management system, a battery management device, and/or an integrated circuit chip. One or more steps of method 2000B are optional and/or can be modified by one or more steps of other embodiments described herein. Additionally, one or more steps of other embodiments described herein may be added to method 2000B. In some embodiments, the BMS may measure or receive temperature data (2050B) of the battery pack. The BMS receives a series of current data for each battery cell (2100B) and a series of voltage data for each battery cell (2150B). In embodiments, the series of current data and voltage data are collected in real-time. In embodiments, the series of current data and voltage data are collected when the battery pack is in operation. In some cases, the series of current data and voltage data are associated with time information (e.g., timestamps).

Next, the BMS determines the capacity of each battery cell (2170B). In one embodiment, the capacity is determined by integrating the current (I) of a respective battery cell over time (t). In one embodiment, the capacity of a battery cell may be determined using expression (33) above. The BMS calculates an ampere-hour-based SOC (Ah-SOC) for each battery cell (2200B) based on the current data for the respective battery cell. In some embodiments, the Ah-SOC is determined based on at least a part of the series of current data for the respective battery cell. In one embodiment, the Ah-SOC for a battery cell is calculated based on the integration of at least a part of the series of current data for the respective battery cell. In some cases, the Ah-SOC for a battery cell is determined based on a capacity of the respective battery cell. In some cases, the capacity of a battery cell is represented by an integration of current over time from when the SOC is 0 to when the SOC is 1.

In one case, an Ah-SOC of a battery cell i for a battery pack at time t can be estimated using expression (38) below.

$$SOC_{Ah,i}(t) = SOC_0 - \frac{\int_{t_0}^{t} I_i(t)dt}{Capacity_i} \quad (38)$$

where SOC$_{Ah,i}$(t) is an Ah-SOC of the battery cell i at time t, SOC$_0$ is an SOC estimate at t$_0$, I$_i$(t) is the measured current data of the battery cell i at time t, and Capacity$_i$ is the capacity of the battery cell i. In one embodiment, the measurement of current can be of the battery pack.

Further, the BMS may determine a resistance of each battery cell (2220B). The resistance of a battery cell is often affected by temperature. In some embodiments, the BMS may retrieve an SOC-OCV model (2240B), where OCV is an open-circuit voltage of a battery cell. In certain embodiments, the SOC-OCV model represents a non-linear relationship. FIG. 14 shows an example of an SOC-OCV model/or function. In the illustrated example, the SOC and OCV has a non-linear relationship. In some cases, the SOC-OCV model is affected by temperature, such that the BMS retrieves the SOC-OCV model by the present temperature at the time of the SOC estimation.

Further, the BMS may calculate a voltage-based SOC (V-SOC) for each battery cell (2250B). In some embodiments, the V-SOC of a battery cell is determined based on at least a part of the series of voltage data for the respective battery cell. In some embodiments, the V-SOC is determined based on at least a part of the series of current data. In some cases, the battery cell has a known SOC-OCV relationship, where OCV refers to the open-circuit voltage of the battery. In embodiments, the BMS estimates the OCV and determines the V-SOC for a battery cell based on the inverse of SOC-VOC relationship. In some cases, the OCV is estimated using the current measurement at the time and the voltage measurement at the time. In some cases, the OCV is estimated using the internal resistance of the battery as a parameter, where the internal resistance of the battery is varied with temperature. In embodiments, the V-SOC is further determined based on an inverse open-circuit-voltage function. In embodiments, the V-SOC is further determined by applying a filter.

In one case, a V-SOC of a battery cell i at time t can be estimated using expression (39) below:

$$SOC_{V,i}(t) = f(OCV^{-1}(V_i(t) + I_i(t)R_{0,i}(T))) \quad (39)$$

where SOC$_V$(t) is a V-SOC at time t, f( ) is a filter function, OCV$^{-1}$( ) is an inverse SOC-OCV function/model, V$_i$(t) is the measured current data of the battery cell i at time t, I$_i$(t) is the measured current data of the battery cell i at time t, and R$_{0,i}$(T) is an estimated resistance of the battery cell i based on the measured temperature T. In some cases, the filter is a low pass filter.

In certain embodiments, the BMS determines an SOC upper bound based on values of the Ah-SOC and V-SOC of battery cells in the battery pack (2300B). In some cases, the SOC upper bound is determined based on the maximum value of the Ah-SOC and V-SOC of battery cells in the battery pack. In some cases, the SOC upper bound is determined based at least in part on differences between the Ah-SOC and V-SOC of battery cells. In one embodiment, the SOC upper bound is determined based at least in part on the largest difference value between the Ah-SOC and V-SOC of the absolute difference values between the Ah-SOC and V-SOC for all battery cells respectively. In some cases, the SOC upper bound is determined based at least in part on a design accuracy of the battery, for example, to fine tune the estimation. In one embodiment, the SOC upper bound is determined at least partially based on the maximum value of the Ah-SOC and V-SOC of battery cells in the battery pack added by the maximum value of the differences between the Ah-SOC and V-SOC for battery cells respectively.

In one case, an upper bound of an SOC estimation at time t for the battery pack can be determined using expression (40) below.

$$SOC_{Ubnd}(t) = \max\{SOC_{Ah,i}(t), SOC_{V,i}(t)\} + \max\{|SOC_{Ah,i}(t) - SOC_{V,i}(t)|\} + E \quad (40)$$

where $SOC_{Ubnd}(t)$ is a upper bound of the SOC estimation at time t, $SOC_{Ah,i}(t)$ is an Ah-SOC at time t, $SOC_{V,i}(t)$ is a V-SOC at time t, and E is an estimated design accuracy (e.g., 3%). In some cases, the $|SOC_{Ah,i}(t) - SOC_{V,i}(t)|$ may be an indication of sensing errors and/or model errors. In this embodiment, a maximum value of Ah-SOC and V-SOC is used. In other embodiments, a different selection criterion of Ah-SOC and V-SOC can be used.

In certain embodiments, the BMS determines an SOC lower bound based on values of the Ah-SOC and V-SOC of battery cells in the battery pack (2350B). In some cases, the SOC lower bound is determined based on the minimum value of the Ah-SOC and V-SOC of battery cells in the battery pack. In some cases, the SOC lower bound is determined based at least in part on differences between the Ah-SOC and V-SOC of battery cells. In some cases, the SOC lower bound is determined based at least in part on a design accuracy of the battery, for example, to fine tune the estimation. In one embodiment, the SOC lower bound is determined based on the minimum value of the Ah-SOC and V-SOC battery cells in the battery pack subtracted by the maximum value of the differences between the Ah-SOC and V-SOC for battery cells respectively.

In one case, a lower bound of an SOC estimation at time t for a battery and/or a battery cell can be determined using expression (41) below.

$$SOC_{Lbnd}(t) = \min\{SOC_{Ah,i}(t), SOC_{V,i}(t)\} - \max\{|SOC_{Ah,i}(t) - SOC_{V,i}(t)|\} - E \quad (41)$$

where $SOC_{Lbnd}(t)$ is a lower bound of the SOC estimation at time t, $SOC_{Ah,i}(t)$ is an Ah-SOC at time t, $SOC_{V,i}(t)$ is a V-SOC at time t, and E is an estimated design accuracy (e.g., 3%). In some cases, the $|SOC_{Ah,i}(t) - SOC_{V,i}(t)|$ may be an indication of sensing errors and/or model errors. In this embodiment, a minimum value of Ah-SOC and V-SOC is used. In other embodiments, a different selection criterion of Ah-SOC and V-SOC can be used.

In some embodiments, the BMS may generate a bounded SOC estimation having the SOC upper bound and the SOC lower bound (2400B). In some cases, the BMS may compare the SOC measurements for battery cells with the SOC upper bound and the SOC lower bound in operation, for example, to determine bounded SOC values. In one example, the BMS sets the bounded SOC value to the SOC upper bound if the corresponding SOC measurement is greater than the SOC upper bound evaluates. In one example, the BMS sets the bounded SOC value to the SOC lower bound if the corresponding SOC measurement is smaller than the SOC lower bound. In some cases, the BMS sets the bounded SOC value to the corresponding SOC measurement if the corresponding SOC measurement is smaller than or equal to the SOC upper bound and the corresponding SOC measurement is greater than or equal to the SOC lower bound. In some cases, the bounded SOC estimation further comprises the bounded SOC values. In some designs, the SOC measurement is received from a conventional SOC measurement device.

Figure 12A:
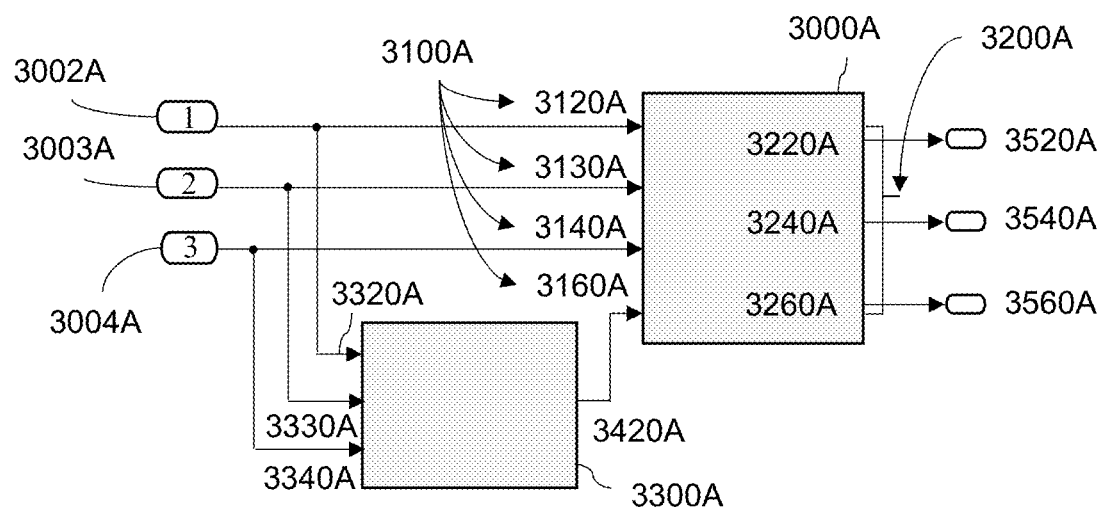
FIG. 12A is a schematic diagram used in a battery management device/chip in accordance with embodiments of the present disclosure.

Referring now to FIG. 12A, a schematic diagram used in a BMS 3000A is shown. In some cases, BMS 3000A is configured to implement any embodiments described herein. In this example, BMS 3000A comprises a plurality of input terminals 3100A including, for example, a current data terminal 3120A configured to receive current data 3002A, a temperature data terminal 3130A configured to receive temperature data 3003A, a voltage data terminal 3140A configured to receive voltage data 3004A, and/or an SOC measurement terminal 3160A. In this example, BMS 3000A is configured to be coupled to an SOC measurement device/chip 3300A. SOC measurement device/chip 3300A is configured to receive current data 3002A at terminal 3320A, temperature data 3003A at terminal 3330A, and voltage data 3004A at terminal 3340A, and output an SOC measurement via 3420A. BMS 3000A receives the SOC measurement via terminal 3160A. Based on the input data received from input terminals 3100A, BMS 3000A is configured to generate a plurality of output data at the plurality of output terminals 3200A. In one embodiment, output terminals 3200A include a bounded SOC terminal 3220A configured to output bounded SOC estimations 3520A, an upper bound terminal 3240A configured to output SOC upper bound 3540A, and/or lower bound terminal 3260A configured to output SOC lower bound 3560A.

Figure 12B:
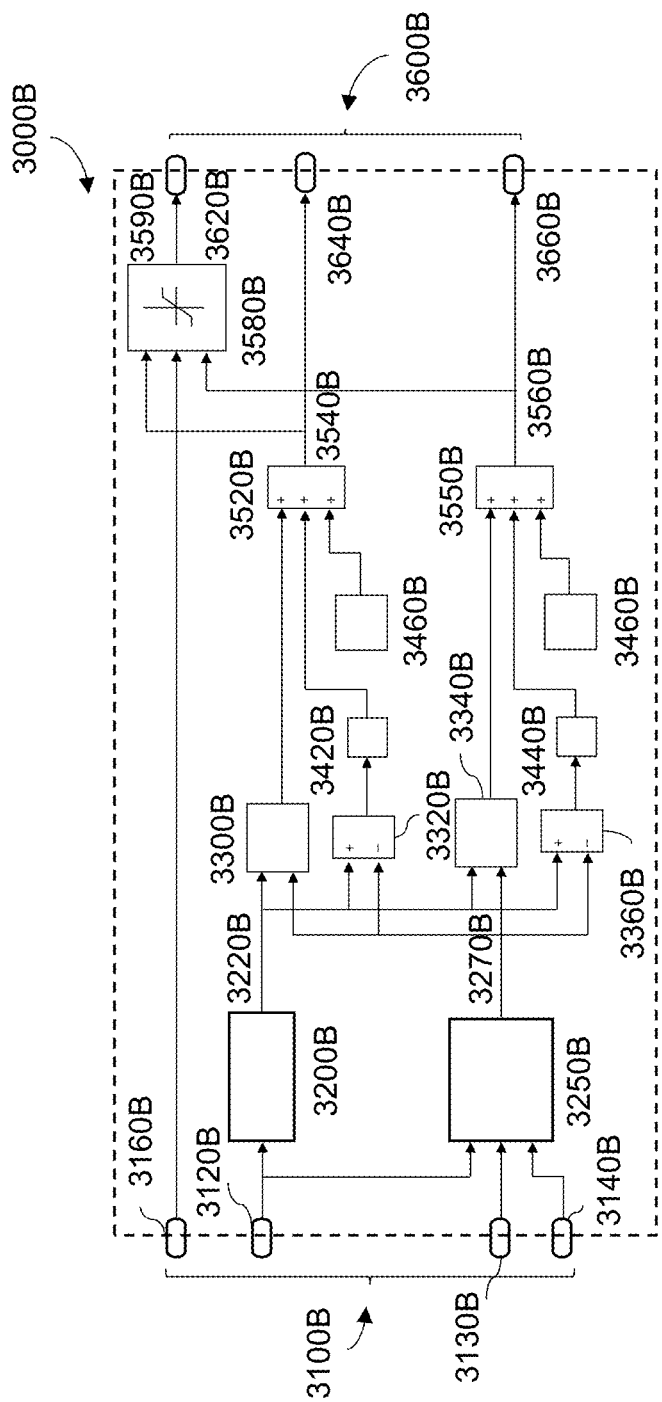
FIG. 12B is another schematic diagram used in a battery management device/chip in accordance with embodiments of the present disclosure.

Referring now to FIG. 12B, a schematic diagram used in a BMS 3000B is shown. In some cases, BMS 3000B is configured to implement any embodiments described herein. In this example, BMS 3000B has a plurality of input terminals 3100B including, for example, a current terminal 3120B configured to receive current data, a temperature terminal 3130B configured to receive temperature data, a voltage terminal 3140B configured to receive voltage data, and an SOC terminal 3160B configured to receive SOC measurements. Current terminal 3120B is coupled to an Ah-based SOC estimator 3200B and a V-based SOC estimator 3250B. Temperature terminal 3130B and voltage terminal 3140B are coupled to V-based SOC estimator 3250B. Ah-based SOC estimator 3200B is configured to output Ah-SOC estimations 3220B based on the current data. V-based SOC estimator 3250B is configured to output V-SOC estimations 3270B based on the current data, temperature data, and voltage data.

Ah-SOC estimator 3200B and V-SOC estimator 3250B are configured to provide Ah-SOC estimations 3220B and V-SOC estimations 3270B, directly or indirectly, to a number of operators including, for example, 3300B, 3320B, 3340B, 3360B, 3420B, 3440B, 3520B, 3550B, and 3580B, for various calculations. In one embodiment, operator 3300B is a maximum operator configured to select a maximum value based on inputs; operator 3360B is a minimum operator configured to select a minimum value based on inputs; and operators 3320B and 3340B are differentiation operators configured to calculate the difference between inputs. In one embodiment, operators 3420B and 3440B are absolute value operators configured to generate the absolute values of the inputs. In one embodiment, operators 3520B and 3440B are arithmetic operators configured to apply arithmetic calculations to inputs. In this example, BMS 3000B includes a design accuracy parameter of a battery (e.g., a battery cell, a battery pack, and/or a cell group) either stored or received at 3460B. Operator 3520B is configured to generate SOC upper bounds 3540B. Operator 3550B is configured to generate SOC lower bounds 3560B.

Operator 3580B is configured to receive the SOC measurements via terminal 3160B, SOC upper bounds 3540B and SOC lower bounds 3560B and determine bounded SOC values 3590B. In for example, to determine bounded SOC values. In one embodiment, operator 3580B implements a saturation function. In one example, operator 3580B sets the bounded SOC value to the SOC upper bound if the corresponding SOC measurement is greater than the SOC upper bound evaluates. In one example, operator 3580B sets the bounded SOC value to the SOC lower bound if the corresponding SOC measurement is smaller than the SOC lower bound. In some cases, operator 3580B sets the bounded SOC value to the corresponding SOC measurement if the corresponding SOC measurement is smaller than or equal to the SOC upper bound and the corresponding SOC measurement is greater than or equal to the SOC lower bound. In some cases, a bounded SOC estimation includes a bounded SOC value, an SOC upper bound, and an SOC lower bound. In this example, BMS 3000B includes a plurality of output terminals 3600B to output the bounded SOC estimations including, for example, a bounded SOC terminal 3620B to output bounded SOC values 3590B, an SOC upper bound terminal 3640B to output SOC upper bounds 3540B, and an SOC lower bound terminal 3660B to output SOC lower bounds 3560B.

Figure 13:
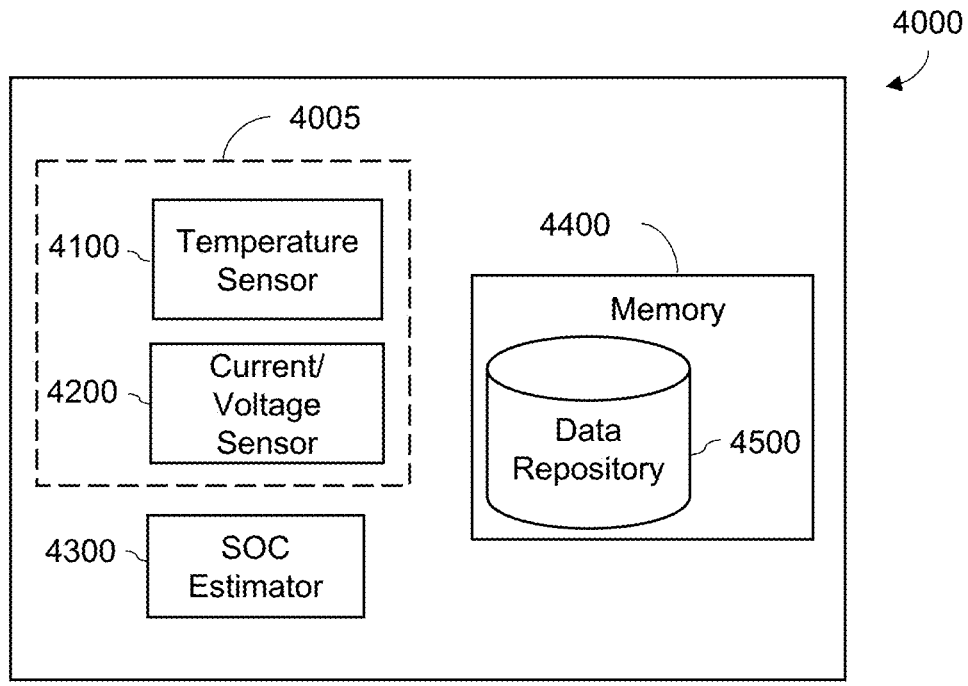
FIG. 13 is a schematic diagram for a battery management system/device/chip in accordance with embodiments of the present disclosure.

Referring now to FIG. 13, a schematic diagram for a BMS 4000 is shown. BMS 4000 is configured to implement any of method 1000A, method 1000B, method 2000A, and/or method 2000B as described herein. In this example, BMS 4000 includes a set of sensors 4005, an SOC estimator 4300, and a memory 4400. In some embodiments, set of sensors 4005 include a temperature sensor 4100 and/or current/voltage sensor(s) 4200. In one embodiment, SOC estimator 4300 is implemented on a computing device (e.g., a processor or a processing unit). In one embodiment, SOC estimator 4300 is implemented using the schematic diagram illustrated in FIG. 12A and/or FIG. 12B. In some cases, memory 4400 includes a data repository 4500, for example, to store the current data, voltage data, temperature data, SOC measurements, bounded SOC estimations, and/or the like.

In some embodiments, a computing device (e.g., SOC estimator 4300) includes a bus that, directly and/or indirectly, couples the following devices: a processor, a memory, an input/output (I/O) port, an I/O component, and a power supply. Any number of additional components, different components, and/or combinations of components may also be included in the computing device. The bus represents what may be one or more busses (such as, for example, an address bus, data bus, or combination thereof). Similarly, in some embodiments, the computing device may include a number of processors, a number of memory components, a number of I/O ports, a number of I/O components, and/or a number of power supplies. Additionally, any number of these components, or combinations thereof, may be distributed and/or duplicated across a number of computing devices.

In one embodiment, memory 4400 includes computer-readable media in the form of volatile and/or nonvolatile memory, transitory and/or non-transitory storage media and may be removable, nonremovable, or a combination thereof. Media examples include Random Access Memory (RAM); Read Only Memory (ROM); Electronically Erasable Programmable Read Only Memory (EEPROM); flash memory; optical or holographic media; magnetic cassettes, magnetic tape, magnetic disk storage or other magnetic storage devices; data transmissions; and/or any other medium that can be used to store information and can be accessed by a computing device such as, for example, quantum state memory, and/or the like. In some embodiments, memory 4400 stores computer-executable instructions for causing a processor (e.g., SOC estimator 4300) to implement aspects of embodiments of system components discussed herein and/or to perform aspects of embodiments of the methods and processes described herein.

Computer-executable instructions may include, for example, computer code, machine-useable instructions, and the like such as, for example, program components capable of being executed by one or more processors associated with a computing device. Program components may be programmed using any number of different programming environments, including various languages, development kits, frameworks, and/or the like. Some or all of the functionality contemplated herein may also, or alternatively, be implemented in hardware and/or firmware.

Data repository 4500 may be implemented using any one of the configurations described below. A data repository may include random access memories, flat files, XML files, and/or one or more database management systems (DBMS) executing on one or more database servers or a data center. A database management system may be a relational (RDBMS), hierarchical (HDBMS), multidimensional (MDBMS), object oriented (ODBMS or OODBMS) or object relational (ORDBMS) database management system, and the like. The data repository may be, for example, a single relational database. In some cases, the data repository may include a plurality of databases that can exchange and aggregate data by data integration process or software application. In an exemplary embodiment, at least part of data repository 4500 may be hosted in a cloud data center. In some cases, a data repository may be hosted on a single computer, a server, a storage device, a cloud server, or the like. In some other cases, a data repository may be hosted on a series of networked computers, servers, or devices. In some cases, a data repository may be hosted on tiers of data storage devices including local, regional, and central.

Various components of BMS 4000 can communicate via or be coupled to via a communication interface, for example, a wired or wireless interface. The communication interface includes, but is not limited to, any wired or wireless short-range and long-range communication interfaces. The wired interface can use cables, wires, and/or the like. The short-range communication interfaces may be, for example, local area network (LAN), interfaces conforming known communications standard, such as Bluetooth® standard, IEEE 802 standards (e.g., IEEE 802.11), a ZigBee® or similar specification, such as those based on the IEEE 802.15.4 standard, or other public or proprietary wireless protocol. The long-range communication interfaces may be, for example, wide area network (WAN), cellular network interfaces, satellite communication interfaces, etc. The communication interface may be either within a private computer network, such as intranet, or on a public computer network, such as the internet.

Figure 15A:
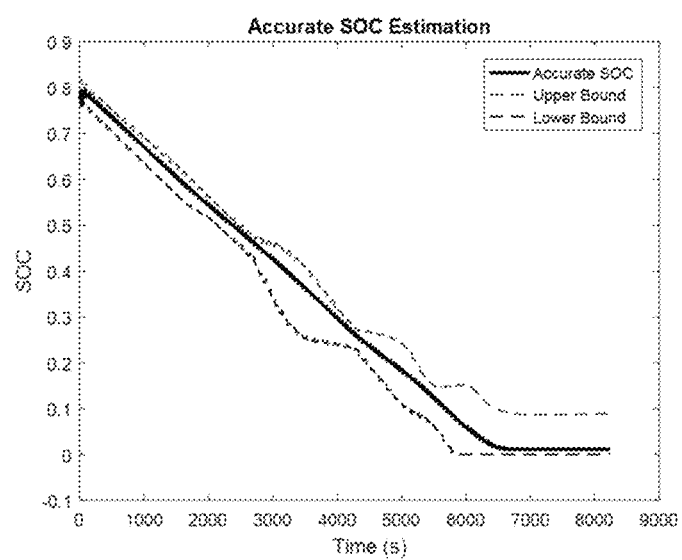
FIGS. 15A and 15B illustrate examples of bounded SOC estimations in accordance with embodiments of the present disclosure.
Figure 15B:
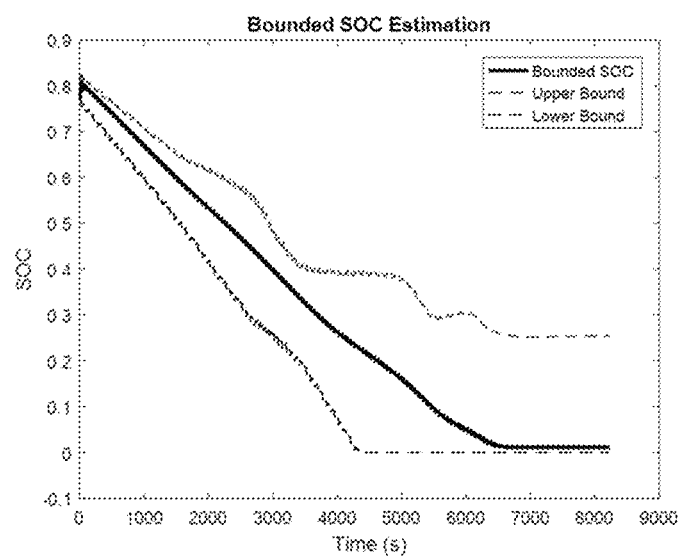

Referring now to FIGS. 15A and 15B, which illustrate examples of bounded SOC estimations. FIG. 15A shows one example of bounded SOC estimations with relatively close upper bound and lower bound, such that a difference between the upper bound and the lower bound is relatively small. FIG. 15B shows one example of bounded SOC estimations with relatively differentiated upper bound and lower bound, such that a difference between the upper bound and the lower bound is relatively large. In one example, a BMS may be configured to recalibrate sensor and/or SOC estimators if the difference between the SOC upper bound and the SOC lower bound is greater than a predetermined threshold.

Additional exemplary embodiments of the foregoing aspect of the present disclosure are described in the following.

A method for estimating a state-of-charge (SOC) of a battery includes receiving a series of current data indicative of measurements of current flowing through the battery, receiving a series of voltage data indicative of measurements of voltages of the battery, calculating an ampere-hour-based SOC estimation (Ah-SOC) using the series of current data, calculating a voltage-based SOC estimation (V-SOC) using the series of voltage data and the series of current data, and generating a bounded SOC estimation comprising an SOC upper bound and an SOC lower bound. The SOC upper bound is determined based on a larger value of the Ah-SOC and V-SOC, and the SOC lower bound is determined based on a smaller value of the Ah-SOC and V-SOC.

Further, the Ah-SOC is determined based on an integration of at least a part of the series of current data, and the Ah-SOC is determined based on a capacity of the battery. Additionally, the V-SOC is determined based on at least one of the series of voltage data.

The method further includes receiving temperature data and determining an internal resistance of the battery based at least in part on the temperature data. The V-SOC is determined based on at least one of the series of current data and the internal resistance of the battery.

Further, the V-SOC is determined based on an inverse open-circuit-voltage function. Additionally, the V-SOC is further determined by applying a filter, where the filter is a low pass filter.

Further, the SOC upper bound is determined based on a difference between the Ah-SOC and V-SOC. Additionally, the SOC upper bound is determined based at least in part on the larger value of the Ah-SOC and V-SOC plus an absolute value of the difference between the Ah-SOC and V-SOC. Moreover, the SOC upper bound is determined at least partially based on a design accuracy of the battery.

Further, the SOC lower bound is determined based at least in part on the larger value of the Ah-SOC and V-SOC minus an absolute value of the difference between the Ah-SOC and V-SOC. Additionally, the SOC lower bound is determined at least partially based on a design accuracy of the battery.

The method further includes receiving an SOC measurement and comparing the SOC measurement with the SOC upper bound and the SOC lower bound to determine a bounded SOC value. The bounded SOC value is set to the SOC upper bound if the SOC measurement is greater than the SOC upper bound. The bounded SOC value is set to the SOC lower bound if the SOC measurement is smaller than the SOC lower bound. The bounded SOC value is set to the SOC measurement if the SOC measurement is smaller than or equal to the SOC upper bound and the SOC measurement is greater than or equal to the SOC lower bound. The bounded SOC estimation further includes the bounded SOC value.

A method for estimating a state-of-charge (SOC) of a battery pack having a plurality of battery cells includes receiving a series of current data indicative of measurements of current flowing through a battery cell for each battery cell of the plurality of battery cells, receiving a series of voltage data indicative of measurements of voltages of a battery cell for each battery cell of the plurality of battery cells, calculating an ampere-hour-based SOC estimation (Ah-SOC) for each battery cell of the plurality of battery cells using the series of current data for a respective battery cell, calculating a voltage-based SOC estimation (V-SOC) for each battery cell of the plurality of battery cells using the series of voltage data and the series of current data for a respective battery cell, and generating a bounded SOC estimation comprising an SOC upper bound and an SOC lower bound. The SOC upper bound is determined based on values of the Ah-SOC and the V-SOC for the plurality of battery cells, and wherein the SOC lower bound is determined based on values of the Ah-SOC and V-SOC for the plurality of battery cells.

Further, the Ah-SOC of a battery cell is determined based on an integration of at least a part of the series of current data of the battery cell. Additionally, the Ah-SOC of the battery cell is determined based on a capacity of the battery cell. Moreover, the V-SOC of a battery cell is determined based on at least one of the series of voltage data of the battery cell.

The method further includes receiving temperature data and determining an internal resistance of the battery cell based at least in part on the temperature data. The V-SOC of the battery cell is determined based on at least a part of the series of current data and the internal resistance of the battery cell.

Further, the V-SOC of the battery cell is further determined based on an inverse open-circuit-voltage function. Additionally, the V-SOC of the battery cell is further determined by applying a filter, where the filter is a low pass filter.

Further, the SOC upper bound is determined based at least in part on a maximum value of the Ah-SOC and V-SOC of the plurality of battery cells. Additionally, the SOC upper bound is determined based on differences between the Ah-SOC and V-SOC of the plurality of the battery cells.

Further, the SOC upper bound is determined based at least in part on a maximum value of the Ah-SOC and V-SOC of the plurality of battery cells plus an absolute value of a maximum difference of the differences between the Ah-SOC and V-SOC of the plurality of the battery cells. Additionally, the SOC upper bound is determined at least partially based on a design accuracy of the battery.

Further, the SOC lower bound is determined based at least in part on a minimum value of the Ah-SOC and V-SOC of the plurality of battery cells. Additionally, the SOC lower bound is further determined based on differences between the Ah-SOC and V-SOC of the plurality of the battery cells.

Further, the SOC lower bound is determined based at least in part on a minimum value of the Ah-SOC and V-SOC of the plurality of battery cells minus an absolute value of a maximum difference of the differences between the Ah-SOC and V-SOC of the plurality of the battery cells. Additionally, the SOC lower bound is determined at least partially based on a design accuracy of the battery.

The method further includes receiving one or more SOC measurements for the plurality of battery cells and comparing the SOC measurement with the SOC upper bound and the SOC lower bound to determine a bounded SOC value. The bounded SOC value is set to the SOC upper bound if the SOC measurement is greater than the SOC upper bound. The bounded SOC value is set to the SOC lower bound if the SOC measurement is smaller than the SOC lower bound. The bounded SOC value is set to the SOC measurement if the SOC measurement is smaller than or equal to the SOC upper bound and the SOC measurement is greater than or equal to the SOC lower bound. The bounded SOC estimation further includes the bounded SOC value.

A method of performing a power estimation process for an electric vehicle using a controller includes performing the power estimation process by estimating an inner state of an energy storage supply of the electric vehicle, estimating at least one of: a state-of-charge (SOC) value and a state-of-health (SOH) value of the energy storage supply based on at least one of: a present current level, a present voltage level, and a present temperature associated with the energy storage supply and time-based information, calculating a first upper bound and a first lower bound that are associated with the SOC value, estimating a bounded SOC value of the energy storage supply based on the SOC value, the first upper bound, and the first lower bound, calculating a second upper bound and a second lower bound that are associated with the SOH value, estimating a bounded SOH value of the energy storage supply based on the SOH value, the second upper bound, and the second lower bound, and controlling an electrification process of the electric vehicle based on at least one of: the bounded SOC value and the bounded SOH value. The inner state represents at least one of: an SOC and an SOH of the energy storage supply.

Any of the steps of the above-mentioned methods is used to control the electrification process of the electric vehicle.

A vehicle comprises a controller including a processor and a memory having processing instructions operable, when executed by the processor, to implement any of the above-mentioned methods.

A battery management system comprises a controller including a processor and a memory having processing instructions operable, when executed by the processor, to implement any of the above-mentioned methods. A vehicle comprises the battery management system.

It should be understood that the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements. The scope is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B or C may be present in a single embodiment; for example, A and B, A and C, B and C, or A and B and C.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art with the benefit of the present disclosure to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Various modifications and additions can be made to the exemplary embodiments discussed without departing from the scope of the presently disclosed subject matter. For example, while the embodiments described above refer to particular features, the scope of this disclosure also includes embodiments having different combinations of features and embodiments that do not include all of the described features. Accordingly, the scope of the subject matter disclosed herein is intended to embrace all such alternatives, modifications, and variations as fall within the scope of the claims, together with all equivalents thereof.

What is claimed is:

1. A controller for performing a power estimation process for an electric vehicle, the controller comprising:
   a processor; and
   a memory including instructions that, when executed by the processor, cause the controller to:
   perform the power estimation process by estimating an inner state of an energy storage supply of the electric vehicle, the inner state representing a state-of-charge (SOC) of the energy storage supply,
   estimate an SOC value of the energy storage supply based on at least one of: a present current level, a present voltage level, a present temperature associated with the energy storage supply, and time-based information; and
   calculate an upper bound and a lower bound that are associated with the SOC value and estimate a bounded SOC value of the energy storage supply based on the SOC value, the upper bound, and the lower bound, and the second lower bound;
   wherein the energy storage supply is a battery, and the instructions, when executed by the processor, further cause the controller to:
   receive a series of current data indicative of measurements of current flowing through the battery;
   receive a series of voltage data indicative of measurements of voltages of the battery;
   calculate an amp-hour SOC estimation (Ah-SOC) using the series of current data;
   calculate a voltage SOC estimation (V-SOC) using the series of voltage data and the series of current data; and
   generate the bounded SOC value of the battery comprising the upper bound and the lower bound;
   wherein the upper bound is determined based on a larger value of the Ah-SOC and V-SOC, and the lower bound is determined based on a smaller value of the Ah-SOC and V-SOC;
   compare an SOC measurement with the upper bound and the lower bound; and
   set the bounded SOC value to the upper bound in response to determining that the SOC measurement is greater than the upper bound,
   wherein the controller controls an electrification process of the electric vehicle based on the bounded SOC value.

2. The controller of claim 1, wherein the time-based information includes one or more historically estimated values of the SOC value.

3. The controller of claim 1, wherein the instructions, when executed by the processor, further cause the controller to estimate the bounded SOC value based on whether a predetermined period has passed.

4. The controller of claim 1, wherein the controller controls the electrification process by at least one of: modifying a cooling of the energy storage supply, modifying charge/discharge limits of the energy storage supply, reducing a number of charging/discharging cycles of the energy storage supply, and modifying a minimum SOC threshold.

5. The controller of claim 1, wherein the controller includes a dual Kalman filter.

6. A method of performing a power estimation process for an electric vehicle using a controller, the method comprising:
   performing the power estimation process by estimating an inner state of an energy storage supply of the electric vehicle, the inner state representing a state-of-charge (SOC) of the energy storage supply;
   estimating an SOC value of the energy storage supply based on at least one of: a present current level, a present voltage level, a present temperature associated with the energy storage supply, and time-based information;
   calculating an upper bound and a lower bound that are associated with the SOC value;
   estimating a bounded SOC value of the energy storage supply based on the SOC value, the first upper bound, and the lower bounds,
   wherein the energy storage supply is a battery, the method further comprising:
   receiving a series of current data indicative of measurements of current flowing through the battery;
   receiving a series of voltage data indicative of measurements of voltages of the battery;
   calculating an amp-hour SOC estimation (Ah-SOC) using the series of current data;
   calculating a voltage SOC estimation (V-SOC) using the series of voltage data and the series of current data; and
   generating the bounded SOC value of the battery comprising the upper bound and the lower bound,
   wherein the upper bound is determined based on a larger value of the Ah-SOC and V-SOC, and the lower bound is determined based on a smaller value of the Ah-SOC and V-SOC;
   comparing an SOC measurement with the upper bound and the lower bound;
   setting the bounded SOC value to the upper bound in response to determining that the SOC measurement is greater than the upper bound; and
   controlling an electrification process of the electric vehicle based on the bounded SOC value.

7. The method of claim 6, wherein the time-based information includes one or more historically estimated values of the SOC value.

8. The method of claim 6, wherein estimating the bounded SOC value is further based on whether a predetermined period has passed.

9. The method of claim 6, wherein the power estimation process is performed by a dual Kalman filter.

10. The method of claim 6, wherein controlling the electrification process includes at least one of: modifying a cooling of the energy storage supply, modifying charge/discharge limits of the energy storage supply, reducing a number of charging/discharging cycles of the energy storage supply, and modifying a minimum SOC threshold.

* * * * *